(12) United States Patent
Sun et al.

(10) Patent No.: US 11,587,983 B2
(45) Date of Patent: Feb. 21, 2023

(54) ELECTROLUMINESCENT DISPLAY MODULE AND DISPLAY DEVICE WITH REDUCED COLOR CAST

(71) Applicants: Chengdu BOE Optoelectronics Technology Co., Ltd., Chengdu (CN); BOE Technology Group Co., Ltd., Beijing (CN)

(72) Inventors: Kaipeng Sun, Beijing (CN); Yuanyou Qiu, Beijing (CN); Weiyun Huang, Beijing (CN); Yue Long, Beijing (CN); Chao Zeng, Beijing (CN); Jiangnan Lu, Beijing (CN); Libin Liu, Beijing (CN); Hongli Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 287 days.

(21) Appl. No.: 16/959,376

(22) PCT Filed: Jul. 31, 2019

(86) PCT No.: PCT/CN2019/098738
§ 371 (c)(1),
(2) Date: Jun. 30, 2020

(87) PCT Pub. No.: WO2021/016962
PCT Pub. Date: Feb. 4, 2021

(65) Prior Publication Data
US 2021/0408153 A1    Dec. 30, 2021

(51) Int. Cl.
*H01L 27/32*    (2006.01)

(52) U.S. Cl.
CPC ...... *H01L 27/3216* (2013.01); *H01L 27/3218* (2013.01); *H01L 27/3276* (2013.01)

(58) Field of Classification Search
CPC ..................... H01L 27/3216; H01L 27/3218
See application file for complete search history.

(56) References Cited

U.S. PATENT DOCUMENTS

| 10,901,314 B2* | 1/2021 | Ji .......................... G03F 1/60 |
| 2015/0200237 A1 | 7/2015 | Yim et al. |

(Continued)

FOREIGN PATENT DOCUMENTS

| CN | 105938704 A | 9/2016 |
| CN | 107785398 A | 3/2018 |

(Continued)

*Primary Examiner* — Kwang-Su Yang
(74) *Attorney, Agent, or Firm* — ArentFox Schiff LLP; Michael Fainberg

(57) ABSTRACT

An electroluminescent display panel includes a plurality of repeating units each including a first conductive layer, a first insulating layer including a first via hole, and an anode including a main body and an auxiliary portion. At least one repeating unit includes a first-color sub-pixel, a second-color sub-pixel, and a third-color sub-pixel; the area of the main body of the third-color sub-pixel is larger than that of the second-color sub-pixel and that of the first-color sub-pixel; and an overlapping area between the main body of the third-color sub-pixel and the first conductive layer is larger than that between the main body of the second-color sub-pixel and the first conductive layer, and the overlapping area between the main body of the third-color sub-pixel and the first conductive layer is larger than that between the main body of the first-color sub-pixel and the first conductive layer.

21 Claims, 18 Drawing Sheets

(56) References Cited

U.S. PATENT DOCUMENTS

| | | | |
|---|---|---|---|
| 2016/0260792 A1 | 9/2016 | Kim et al. | |
| 2018/0062102 A1 | 3/2018 | Kim | |
| 2018/0062107 A1 | 3/2018 | Kim et al. | |
| 2018/0069065 A1 | 3/2018 | Chen et al. | |
| 2019/0019848 A1* | 1/2019 | Sun | H01L 27/326 |

FOREIGN PATENT DOCUMENTS

| | | |
|---|---|---|
| CN | 107799548 A | 3/2018 |
| CN | 107808892 A | 3/2018 |

* cited by examiner

ELECTROLUMINESCENT DISPLAY MODULE AND DISPLAY DEVICE WITH REDUCED COLOR CAST

The present application is a national phase entry under 35 U.S.C. § 371 of International Application No. PCT/CN2019/098738, filed on Jul. 31, 2019. The entire disclosure of the above application is incorporated herein by reference.

FIELD

Embodiments of the present disclosure relate to the field of display technology, and particularly relates to an electroluminescent display panel and a display device.

BACKGROUND

With continuous development of display technology, organic light emitting diode (OLED) display panels have been increasingly used in various electronic devices due to their advantages of self-luminescence, wide viewing angle, high contrast, low power consumption, high response speed, and the like. As people's requirements on OLED display panels increase, to achieve a high-resolution design in a display panel, an OLED display panel usually adopts an SPR pixel arrangement, that is, pixel borrowing.

SUMMARY

An embodiment of the present disclosure provides an electroluminescent display panel, including:
a plurality of repeating units, each of which includes a plurality of sub-pixels, each of the sub-pixels including:
a first conductive layer disposed on the substrate;
a first insulating layer disposed on the first conductive layer and including a first via hole, the first via hole exposing a portion of the first conductive layer; and
an anode disposed on the first insulating layer and including a main body and an auxiliary portion electrically connected to each other; the auxiliary portion being electrically connected to the first conductive layer through the first via hole;
at least one of the plurality of repeating units including a first-color sub-pixel, a second-color sub-pixel, and a third-color sub-pixel, wherein
the area of the main body of the third-color sub-pixel is larger than the area of the main body of the second-color sub-pixel and the area of the main body of the first-color sub-pixel; and
an overlapping area between the main body of the third-color sub-pixel and the first conductive layer is larger than an overlapping area between the main body of the second-color sub-pixel and the first conductive layer, and the overlapping area between the main body of the third-color sub-pixel and the first conductive layer is larger than an overlapping area between the main body of the first-color sub-pixel and the first conductive layer.

In some embodiments, in an embodiment of the present disclosure, the overlapping area between the main body of the third-color sub-pixel and the first conductive layer is larger than the sum of the overlapping area between the main body of the second-color sub-pixel and the first conductive layer and the overlapping area between the main body of the first-color sub-pixel and the first conductive layer.

In some embodiments, in an embodiment of the present disclosure, the main body of at least one of the sub-pixels has at least one symmetry axis, and an orthographic projection of the main body on the substrate overlaps an orthographic projection of the first conductive layer on the substrate; and
an area ratio of the first conductive layer whose orthographic projection overlapping the orthographic projection of the main body of the at least one sub-pixel on the substrate, on two sides of the at least one symmetry axis is within a range of 1±0.1.

In some embodiments, in an embodiment of the present disclosure, the first conductive layer whose orthographic projection overlapping the orthographic projection of the main body of the at least one sub-pixel on the substrate is substantially axisymmetric about the at least one symmetry axis.

In some embodiments, in an embodiment of the present disclosure, the first conductive layer includes a first power line and a first connection line spaced apart from each other; and wherein in each of the sub-pixels, the auxiliary portion is electrically connected to the first connection line through the first via hole.

In some embodiments, in an embodiment of the present disclosure, each of the plurality of repeating units includes one first-color sub-pixel, one second-color sub-pixel pair and one third-color sub-pixel arranged in a third direction, wherein the second-color sub-pixel pair includes two second-color sub-pixels arranged in a fourth direction; and
the plurality of repeating units are arranged in the third direction to form repeating unit groups, which are arranged in the fourth direction, and the repeating units in every two adjacent repeating unit groups are arranged in a staggered manner.

In some embodiments, in an embodiment of the present disclosure, in at least one sub-pixel, the ratio of the size of the main body in the fourth direction to the size of the main body in the third direction is γ1, and the value range of γ1 is 1.2-3.

In some embodiments, in an embodiment of the present disclosure, the electroluminescent display panel further includes a second insulating layer between the first conductive layer and the substrate, and a second conductive layer between the second insulating layer and the substrate, wherein the second conductive layer includes a second power line and a second connection line spaced apart from each other;
the second insulating layer has a second via hole exposing the second connection line, and a third via hole exposing a portion of the second power line;
the first power line is electrically connected with the second power line through the third via hole; and
the first connection line is electrically connected with the second connection line through the second via hole.

In some embodiments, in an embodiment of the present disclosure, for the first connection line and the second connection line that are electrically connected with each other, an orthographic projection of the first connection line on the substrate at least partially overlaps an orthographic projection of the second connection line on the substrate; and
an orthographic projection of the first power line on the substrate at least partially overlaps an orthographic projection of the second power line on the substrate.

In some embodiments, in an embodiment of the present disclosure, the first power line includes a plurality of sub-power lines arranged in a first direction and extending in a second direction, and conduction lines electrically connecting the sub-power lines, wherein the first direction is different from the second direction.

In some embodiments, in an embodiment of the present disclosure, in the third-color sub-pixel, an orthographic projection of the main body on the substrate overlaps the orthographic projection of the first power line on the substrate; and the main body has a first symmetry axis in the first direction; and in the third-color sub-pixel, the first power line whose orthographic projection overlapping the orthographic projection of the main body on the substrate is substantially axisymmetric about the first symmetry axis, and the center of the first power line whose orthographic projection overlapping the orthographic projection of the main body on the substrate substantially overlaps the center of the main body.

In some embodiments, in an embodiment of the present disclosure, the conduction lines include first conduction lines; and in the third-color sub-pixel, the orthographic projection of the main body on the substrate covers orthographic projections of at least one of the sub-power lines and at least two first conduction lines on the substrate.

In some embodiments, in an embodiment of the present disclosure, in the third-color sub-pixel, the sub-power line whose orthographic projection overlapping the orthographic projection of the main body on the substrate is substantially axisymmetric about the first symmetry axis, and the sub-power line whose orthographic projection overlapping the orthographic projection of the main body on the substrate covers the center of the main body; and in the third-color sub-pixel, the main body has a second symmetry axis in the second direction, and the at least two first conduction lines whose orthographic projections overlapping the orthographic projection of the main body on the substrate are substantially axisymmetric about the second symmetry axis.

In some embodiments, in an embodiment of the present disclosure, in the third-color sub-pixel, the sub-power line and the conduction lines overlapping the orthographic projection of the main body on the substrate adopts one of a cross-shaped, a pozidriv-shaped, a #-shaped, an I-shaped, an II-shaped and an III-shaped configuration.

In some embodiments, in an embodiment of the present disclosure, in the third-color sub-pixel, an orthographic projection of the main body on the substrate overlaps orthographic projections of at least two sub-power lines on the substrate; and the at least two sub-power lines whose orthographic projections overlapping the orthographic projection of the main body on the substrate are arranged in parallel and in equal interval.

In some embodiments, in an embodiment of the present disclosure, in the third-color sub-pixel, in the third-color sub-pixel, the main body has a second symmetry axis in the second direction; and the at least two sub-power lines whose orthographic projections overlapping the orthographic projection of the main body on the substrate are disposed on two sides of the center of the main body substantially axisymmetrically about the second symmetry axis.

In some embodiments, in an embodiment of the present disclosure, the third direction is same as the first direction, and the fourth direction is same as the second direction; the size of the main body of the third-color sub-pixel in the second direction is larger than the size of the main body of the third-color sub-pixel in the first direction; and the size of the main body of the first-color sub-pixel in the second direction is larger than the size of the main body of the first-color sub-pixel in the first direction.

In some embodiments, in an embodiment of the present disclosure, the orthographic projection of the main body in the third-color sub-pixel on the substrate does not overlap the orthographic projection of the first connection line on the substrate.

In some embodiments, in an embodiment of the present disclosure, the conduction lines include second conduction lines; and one second conduction line is provided between the two second-color sub-pixels in the second-color sub-pixel pair.

In some embodiments, in an embodiment of the present disclosure, the second conduction lines extend linearly along the first direction.

In some embodiments, in an embodiment of the present disclosure, for the third-color sub-pixel and the second-color sub-pixel pair in the same repeating unit, the first conduction lines whose orthographic projections overlapping the orthographic projection of the main body of the third-color sub-pixel on the substrate, and the second conduction line provided between the two second-color sub-pixels in the second-color sub-pixel pair extend substantially on the same straight line along the first direction.

In some embodiments, in an embodiment of the present disclosure, the conduction lines include third conduction lines; one third conduction line is provided between a first-color sub-pixel in a repeating unit group, and a third-color sub-pixel that is in an adjacent repeating unit group and nearest to the first-color sub-pixel; and the third conduction line is disposed on a side of the main body of the corresponding third-color sub-pixel away from the auxiliary portion.

In some embodiments, in an embodiment of the present disclosure, the third conduction line is in at least one of a polyline shape and a curved shape.

In some embodiments, in an embodiment of the present disclosure, the third conduction line includes a first conduction portion and a second conduction portion electrically connected with each other;

the first conduction portion extends in the first direction, and the second conduction portion extends in a direction intersecting the first direction.

In some embodiments, in an embodiment of the present disclosure, in the first-color sub-pixel, the size of an overlapping area between the orthographic projection of the main body on the substrate and the nearest sub-power line is smaller than 80% of the width of the sub-power line in the first direction.

In some embodiments, in an embodiment of the present disclosure, in the first-color sub-pixel, the area of the orthographic projection of the main body on the substrate is smaller than 10% of the area of the main body.

In some embodiments, in an embodiment of the present disclosure, at least a portion of the sub-power line whose orthographic projection is nearest to the orthographic projection of the main body of the first-color sub-pixel has a first width, and the sub-power line whose orthographic projection is covered by the orthographic projection of the main body of the third-color sub-pixel has a second width; and the first width is smaller than the second width.

In some embodiments, in an embodiment of the present disclosure, the widths of sub-power lines on two sides of a long axis of the main body of the first-color sub-pixel are different, and the width of the sub-power line nearer to the first-color sub-pixel is smaller than the width of the sub-power line on the other side.

In some embodiments, in an embodiment of the present disclosure, in the second-color sub-pixel, the size of an overlapping area between the orthographic projection of the main body on the substrate and the nearest sub-power line is smaller than 80% of the width of the sub-power line in the first direction.

In some embodiments, in an embodiment of the present disclosure, in the second-color sub-pixel, the orthographic projection of the main body on the substrate is smaller than 10% of the area of the main body.

In some embodiments, in an embodiment of the present disclosure, at least a portion of the sub-power line whose orthographic projection is nearest to the orthographic projection of the main body of the second-color sub-pixel has a third width, and the sub-power line whose orthographic projection is covered by the orthographic projection of the main body of the third-color sub-pixel has a second width; and the third width is smaller than the second width.

In some embodiments, in an embodiment of the present disclosure, the third direction is same as the second direction, and the fourth direction is same as the first direction; and the size of the main body of the third-color sub-pixel in the first direction is larger than the size of the main body of the third-color sub-pixel in the second direction; and the size of the main body of the first-color sub-pixel in the first direction is larger than the size of the main body of the first-color sub-pixel in the second direction.

In some embodiments, in an embodiment of the present disclosure, in the first-color sub-pixel, an orthographic projection of the main body on the substrate overlaps orthographic projections of at least two sub-power lines on the substrate; and the at least two sub-power lines whose orthographic projections overlapping the orthographic projection of the main body on the substrate are arranged in parallel and in equal interval.

In some embodiments, in an embodiment of the present disclosure, in the first-color sub-pixel, the main body has a third symmetry axis in the second direction; and the at least two sub-power lines whose orthographic projections overlapping the orthographic projection of the main body on the substrate are disposed on two sides of the center of the main body substantially axisymmetrically about the third symmetry axis.

In some embodiments, in an embodiment of the present disclosure, in the same sub-pixel, the orthographic projection of the main body on the substrate does not overlap an orthographic projection of the first via hole on the substrate.

In some embodiments, in an embodiment of the present disclosure, in the same sub-pixel, an orthographic projection of the second via hole on the substrate does not overlap the orthographic projection of the first via hole on the substrate.

In some embodiments, in an embodiment of the present disclosure, the third direction is same as the first direction, and the fourth direction is same as the second direction; the second-color sub-pixel pair includes a first second-color sub-pixel and a second second-color sub-pixel; and in the same repeating unit group, the first via hole of the first-color sub-pixel, the first via hole of the second second-color sub-pixel in the second-color sub-pixel pair, and the second via hole of the third-color sub-pixel are arranged on the same straight line along the first direction.

In some embodiments, in an embodiment of the present disclosure, the third direction is same as the second direction, and the fourth direction is same as the first direction; the second-color sub-pixel pair includes a first second-color sub-pixel and a second second-color sub-pixel;

in at least one type of repeating unit group in odd-numbered repeating unit groups and even-numbered repeating unit groups, the first via holes of the first-color sub-pixels and the first via holes of the two second-color sub-pixels in the second-color sub-pixel pairs, in the same row of repeating units are arranged on the same straight line along the first direction; and in at least one type of repeating unit group in odd-numbered repeating unit groups and even-numbered repeating unit groups, the first via holes of the third-color sub-pixels in the same row of repeating units are arranged on the same straight line along the first direction.

In some embodiments, in an embodiment of the present disclosure, the first power line is configured as a power line that transmits a driving voltage.

In some embodiments, in an embodiment of the present disclosure, the first conductive layer includes a first bridging line, a first connection line, and a plurality of signal line groups arranged at intervals in the first direction, wherein in each of the sub-pixels, the auxiliary portion is electrically connected to the first connection line through the first via hole;

each of the signal line groups includes at least two different signal lines, and the signal lines extend along the second direction; and in at least one sub-pixel, the orthographic projection of the main body on the substrate overlaps an orthographic projection of at least one of the signal line groups on the substrate; and center lines in the second direction of the signal lines in the signal line group whose orthographic projection overlapping the orthographic projection of the main body on the substrate are substantially axisymmetric about a symmetry axis of the main body along the second direction.

In some embodiments, in an embodiment of the present disclosure, the third direction is same as the first direction, and the fourth direction is same as the second direction; the size of the main body of the third-color sub-pixel in the second direction is larger than the size of the main body of the third-color sub-pixel in the first direction; and the size of the main body of the first-color sub-pixel in the second direction is larger than the size of the main body of the first-color sub-pixel in the first direction.

In some embodiments, in an embodiment of the present disclosure, the size of the main body of the first-color sub-pixel in the first direction is larger than the size of the main body of the third-color sub-pixel in the first direction;

in the first-color sub-pixel, the orthographic projection of the main body on the substrate overlaps an orthographic projection of at least one of the signal line groups on the substrate; the main body has a third symmetry axis in the second direction; and in the first-color sub-pixel, center lines in the second direction of the signal lines in the signal line group whose orthographic projection overlapping the orthographic projection of the main body on the substrate are substantially axisymmetric about the second symmetry axis.

In some embodiments, in an embodiment of the present disclosure, in the third-color sub-pixel, an overlapping area between the orthographic projection of the main body on the substrate and the orthographic projection of the nearest signal line group on the substrate is smaller than 10% of the area of the main body.

In some embodiments, in an embodiment of the present disclosure, the size of the main body of the third-color sub-pixel in the first direction is larger than the size of the main body of the first-color sub-pixel in the first direction;

in the first-color sub-pixel, the orthographic projection of the main body on the substrate overlaps an orthographic projection of at least one of the signal line groups on the substrate; the main body of the first-color sub-pixel has a third symmetry axis in the second direction; and in the first-color sub-pixel, center lines in the second direction of the signal lines in the signal line group whose orthographic projection overlapping the orthographic projection of the main body on the substrate are substantially axisymmetric about the third symmetry axis.

In some embodiments, in an embodiment of the present disclosure, in the third-color sub-pixel, the orthographic projection of the main body on the substrate overlaps an orthographic projection of at least one of the signal line groups on the substrate and an orthographic projection of at least one of the first bridging line on the substrate;

the main body of the third-color sub-pixel has a second symmetry axis in the second direction; and in the third-color sub-pixel, a center line in the second direction of the signal lines in the signal line group whose orthographic projection overlapping the orthographic projection of the main body on the substrate, and a center line in the second direction of the first bridging line are substantially axisymmetric about the second symmetry axis.

In some embodiments, in an embodiment of the present disclosure, in the same sub-pixel, the orthographic projection of the main body on the substrate does not overlap an orthographic projection of the first via hole on the substrate.

In some embodiments, in an embodiment of the present disclosure, for one of the repeating unit groups, the first via holes of the third-color sub-pixels and the first via holes of the second second-color sub-pixels in the second-color sub-pixel pairs, in the repeating unit group, and the first via holes of the first second-color sub-pixels in the second-color sub-pixel pairs adjacent to the repeating unit group are arranged on the same straight line along the first direction.

In some embodiments, in an embodiment of the present disclosure, the third direction is same as the second direction, and the fourth direction is same as the first direction; the size of the main body of the third-color sub-pixel in the first direction is larger than the size of the main body of the third-color sub-pixel in the second direction; and the size of the main body of the first-color sub-pixel in the first direction is larger than the size of the main body of the first-color sub-pixel in the second direction.

In some embodiments, in an embodiment of the present disclosure, in the first-color sub-pixel, the orthographic projection of the main body on the substrate overlaps orthographic projections of two adjacent signal line groups on the substrate; the main body of the first-color sub-pixel has a third symmetry axis in the second direction; and in the first-color sub-pixel, the positions of the two signal line groups whose orthographic projections overlapping the orthographic projection of the main body on the substrate are substantially axisymmetric about the third symmetry axis.

In some embodiments, in an embodiment of the present disclosure, in the third-color sub-pixel, the orthographic projection of the main body on the substrate overlaps orthographic projections of two adjacent signal line groups on the substrate; the main body of the third-color sub-pixel has a second symmetry axis in the second direction; and in the third-color sub-pixel, the positions of the two signal line groups whose orthographic projections overlapping the orthographic projection of the main body on the substrate are substantially axisymmetric about the second symmetry axis.

In some embodiments, in an embodiment of the present disclosure, in the third-color sub-pixel, the orthographic projection of the main body on the substrate covers an orthographic projection of one of the first bridging line on the substrate; and the first bridging line whose orthographic projection overlapping the orthographic projection of the main body on the substrate is substantially axisymmetric about the second symmetry axis.

In some embodiments, in an embodiment of the present disclosure, in each second-color sub-pixel, the orthographic projection of the main body on the substrate overlaps an orthographic projection of one of the signal line groups on the substrate; and the two signal line groups whose orthographic projections overlapping the two second-color sub-pixels in the second-color sub-pixel pair are adjacent.

In some embodiments, in an embodiment of the present disclosure, the main bodies of the two second-color sub-pixels in the second-color sub-pixel pair are substantially axisymmetric about a fourth symmetry axis;

the two signal line groups whose orthographic projections overlapping the two second-color sub-pixels in the second-color sub-pixel pair are substantially axisymmetric about the fourth symmetry axis.

In some embodiments, in an embodiment of the present disclosure, in at least one type of repeating unit group in odd-numbered repeating unit groups and even-numbered repeating unit groups, the first via holes of the first-color sub-pixels, and the first via holes of the first second-color sub-pixels and the first via holes of the second second-color sub-pixels in the second-color sub-pixel pairs, in the same row of repeating units are arranged on the same straight line along the first direction; and in at least one type of repeating unit group in odd-numbered repeating unit groups and even-numbered repeating unit groups, the first via holes of the third-color sub-pixels in the same row of repeating units are arranged on the same straight line along the first direction.

In some embodiments, in an embodiment of the present disclosure, each of the signal line groups includes a data line configured to transmit a data signal and a power line configured to transmit a driving voltage.

An embodiment of the present disclosure further provides a display device, including the above-mentioned electroluminescent display panel.

DETAILED DESCRIPTION OF THE EMBODIMENTS

Figure 1:
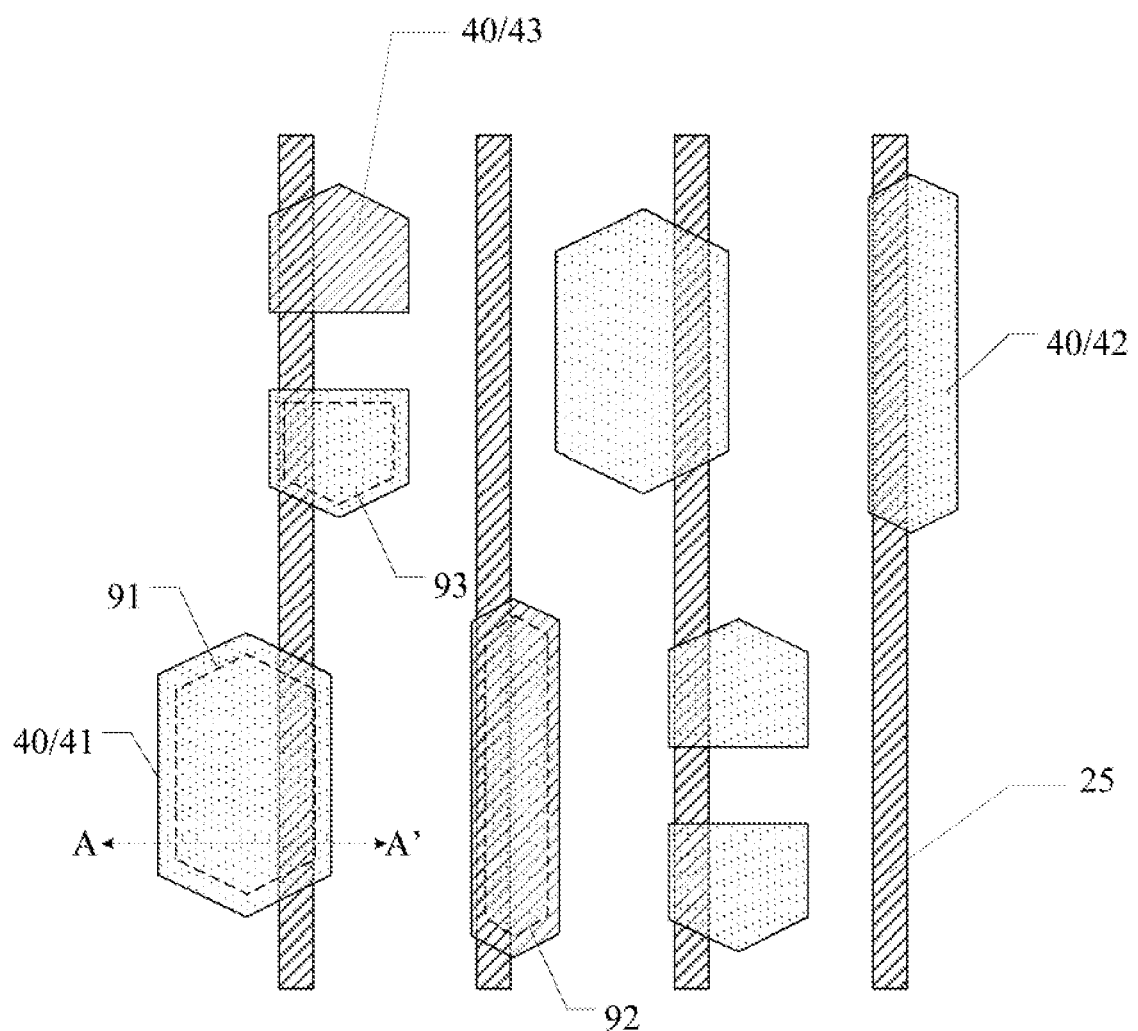
FIG. 1 is a schematic structural diagram of a related electroluminescent display panel.

To make the objectives, technical solutions and advantages of the embodiments of the present disclosure clearer, the technical solutions in the embodiments of the present disclosure will be described clearly and completely in conjunction with the accompanying drawings in the embodiments of the present disclosure. Obviously, the described embodiments are only a part of the embodiments of the present disclosure, and not all the embodiments. Based on the embodiments described herein, all other embodiments obtained by those of ordinary skill in the art without any inventive effort shall fall into the protection scope of the present disclosure.

Unless otherwise defined, technical or scientific terms used in the present disclosure shall have the ordinary meanings understood by those of ordinary skill in the art to which the present disclosure pertains. The terms "first", "second" and the like used in present disclosure do not indicate any order, quantity, or importance, but are only used to distinguish different components. Words such as "comprise" or "include" indicate that an element or item appearing before such a word covers listed elements or items appearing after the word and equivalents thereof, and does not exclude other elements or items. Words such as "connect" or "interconnect" are not limited to physical or mechanical connections, but may include electrical connections, regardless of direct or indirect connection.

A typical OLED display panel includes a base substrate, a driving circuit disposed on the base substrate, a planarization layer disposed on a side of the driving circuit facing away from the base substrate, an anode disposed on a side of the planarization layer away from the base substrate, a light emitting layer disposed on a side of the anode facing away from the base substrate, and a cathode disposed on a side of the light emitting layer facing away from the base substrate.

The driving circuit on the base substrate generally includes signal lines formed in a source-drain metal layer, such as data lines for transmitting or writing data and power lines (VDD lines) for transmitting a driving voltage. Before the anode is prepared on the side of the driving circuit facing away from the base substrate, data lines and one power line (VDD line) need to be prepared on the driving circuit, thereafter an insulating layer is prepared, the other power line (VDD line) is prepared on the insulating layer, then the planarization layer (PLN) is prepared on the other power line (VDD line), and thereafter the anode is prepared on the planarization layer (PLN), so that the subsequently prepared anode has a higher flatness. The two power lines (VDD lines) are electrically connected to each other through a via hole in the insulating layer to reduce the resistance of the power lines (VDD lines). However, due to a large thickness of the signal lines formed in the source-drain metal layer, the planarization layer on the signal lines cannot completely planarize the signal lines, resulting in unevenness of the anode on the planarization layer and the light emitting layer on the anode, and forming an asymmetric protrusion on the anode and the light emitting layer on the anode, thereby resulting in a color cast phenomenon when viewed from the left and right sides of the normal of the display panel at the same angle with respect to the normal of the display panel.

Figure 2:
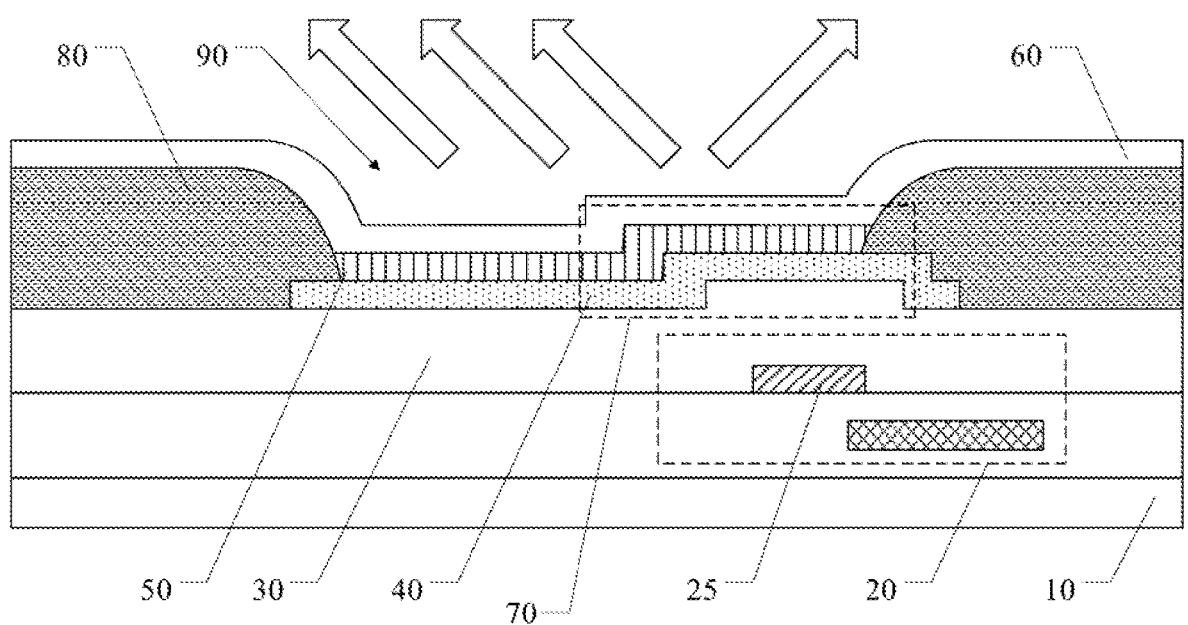
FIG. 2 is a schematic structural diagram of a sectional view of the electroluminescent display panel taken along line AA' as indicated in FIG. 1.

FIG. 1 is a schematic structural diagram of a top view of some OLED display panels. FIG. 2 is a sectional view of a sub-pixel in an OLED display panel in FIG. 1. As shown in FIGS. 1 and 2, the OLED display panel includes a substrate 10, a driving circuit 20, a planarization layer 30, an anode 40, a light emitting layer 50, a cathode 60 and a pixel defining layer 80. The pixel defining layer 80 has an opening, to define an effective light emitting area 90 through the opening. For example, the pixel defining layer 80 acts on the anode 41 in a blue sub-pixel to define a blue effective light emitting area 91; the pixel defining layer 80 acts on the anode 42 in a red sub-pixel to define a red effective light emitting area 92; and the pixel defining layer 80 acts on the anode 43 in a green sub-pixel to define a green effective light emitting area 93. The driving circuit 20 includes the other power line 25 formed in a source-drain metal layer. FIG. 1 shows a positional relationship between the other power line 25 and the anode 40. As shown in FIGS. 1 and 2, as the other power line 25 has a large thickness, the planarization layer 30 covering the other power line 25 cannot completely planarize the display panel, resulting in unevenness of the anode 40 on the planarization layer 30 and the light emitting layer 50 on and the anode 40, thereby forming an asymmetric protrusion 70 on the anode 40 and the light emitting layer 50 on the anode 40. The asymmetric protrusion 70 is asymmetric with respect to a symmetry axis of the anode 40 along an extending direction of the other power line 25, so that the asymmetric protrusion 70 emits different light to the left and right sides of the normal of the display panel, resulting in a color cast phenomenon when viewed from the left and right sides of the normal of the display panel at the same angle with respect to the normal of the display panel. For example, the color of the display panel viewed from the left side of the normal of the display panel at an angle of 30 degrees with respect to the normal of the display panel and the color of the display panel viewed from the right side of the normal of the display panel at an angle of 30 degrees with respect to the normal of the display panel are different, resulting in the above-mentioned color cast phenomenon.

In view of this, embodiments of the present disclosure provide an electroluminescent display panel and a display device. The electroluminescent display panel may include a plurality of repeating units, each repeating unit including a plurality of sub-pixels, each sub-pixel including a first conductive layer disposed on a substrate, a first insulating layer above the first conductive layer, and an anode on the first insulating layer. Furthermore, the first insulating layer includes a first via hole, and the anode includes a main body and an auxiliary portion electrically connected to each other. The first via hole exposes a portion of the first conductive layer, and the auxiliary portion is electrically connected to the first conductive layer through the first via hole. At least one of the plurality of repeating units includes a first-color sub-pixel, a second-color sub-pixel, and a third-color sub-pixel. The area of the main body of the third-color sub-pixel is larger than the area of the main body of the second-color sub-pixel and the area of the main body of the first-color sub-pixel; and an overlapping area between the main body of the third-color sub-pixel and the first conductive layer is larger than an overlapping area between the main body of the second-color sub-pixel and the first conductive layer, and the overlapping area between the main body of the third-color sub-pixel and the first conductive layer is larger than an overlapping area between the main body of the first-color sub-pixel and the first conductive layer. This can at least eliminate the asymmetry of light emission in a central area, thereby improving or even eliminating the color cast phenomenon of the display panel.

The present disclosure is described in detail below in conjunction with specific embodiments. It should be noted that the embodiments are intended to better explain the present disclosure, but do not limit the present disclosure.

Some electroluminescent display panels provided by embodiments of the present disclosure, as shown in FIGS. 3 to 8b, may include a plurality of repeating units 001, each repeating unit 001 including a plurality of sub-pixels, and each sub-pixel may include a first conductive layer 200 disposed on a substrate 100, a first insulating layer 300 above the first conductive layer 200, and an anode 400 on the first insulating layer 300. Furthermore, the first insulating layer 300 includes a first via hole 310, and the anode 400 includes a main body 410 and an auxiliary portion 420 electrically connected to each other. The first via hole 310 exposes a portion of the first conductive layer 200, and the auxiliary portion 420 is electrically connected to the first conductive layer 200 through the first via hole 310. Furthermore, at least one of the plurality of repeating units may include a first-color sub-pixel 010, a second-color sub-pixel, and a third-color sub-pixel 030. Where the area of the main body 413 of the third-color sub-pixel 030 is larger than the area of the main body of the second-color sub-pixel and the area of the main body 400 of the first-color sub-pixel 010.

An overlapping area between the main body 413 of the third-color sub-pixel 030 and the first conductive layer 200 is larger than an overlapping area between the main body of the second-color sub-pixel and the first conductive layer 200, and the overlapping area between the main body 413 of the third-color sub-pixel 030 and the first conductive layer 200 is larger than an overlapping area between the main body 411 of the first-color sub-pixel 010 and the first conductive layer 200. Thus, the first conductive layer 200 may have a hollow pattern, and a portion of the hollow pattern with orthographic projection thereof overlapping the orthographic projection of the main body 410 on the substrate 100 is configured in such a way that at least a central area AA of the main body 410 is substantially flat.

In some embodiments, in an embodiment of the present disclosure, as shown in FIGS. 3a to 8c, the main body and the auxiliary portion in the same sub-pixel are of an integrated structure. For example, the main body and the auxiliary portion in the same sub-pixel are formed by one patterning process.

Figure 3:
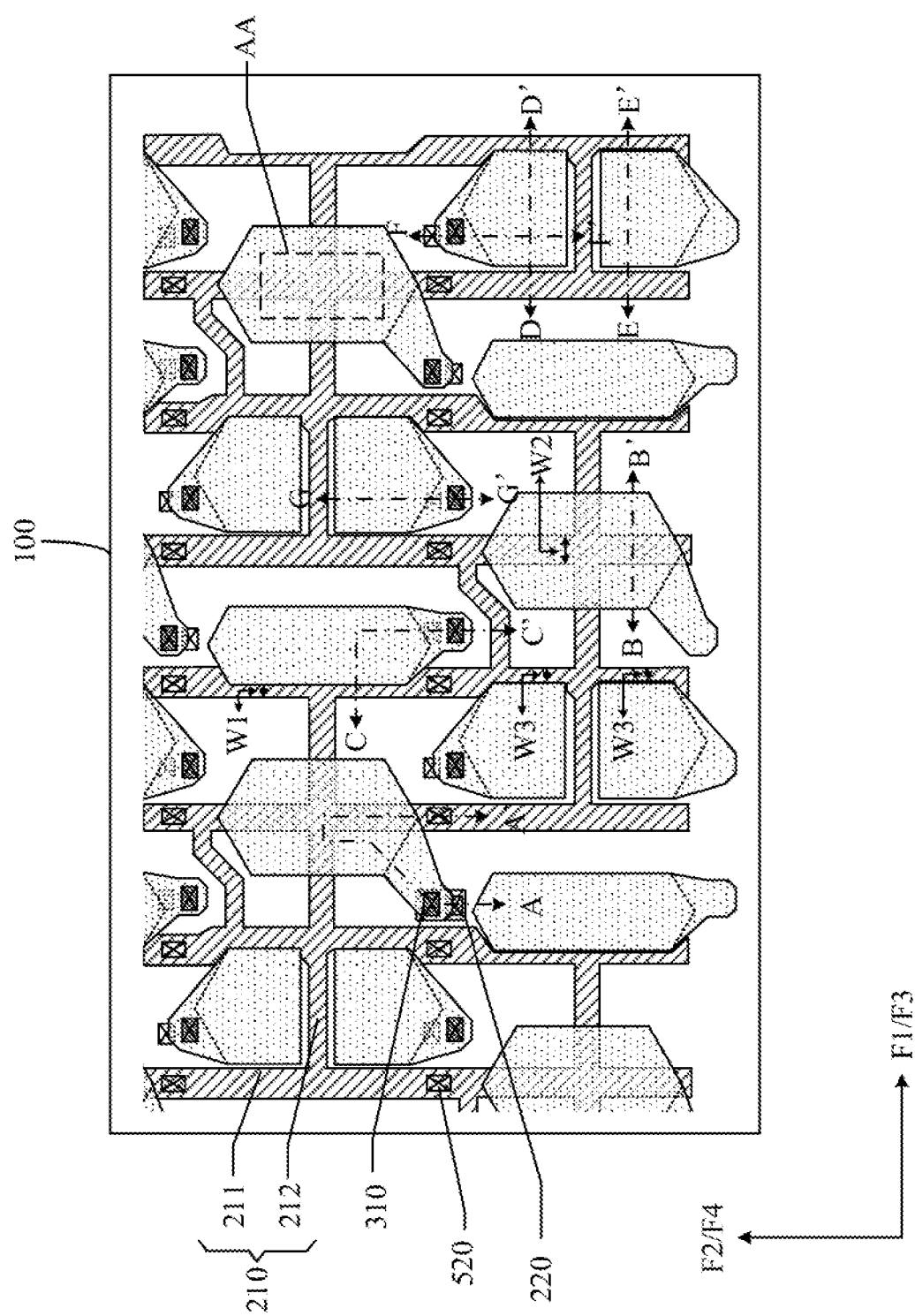
FIG. 3 is a schematic structural diagram of an electroluminescent display panel provided by an embodiment of the present disclosure.
Figure 4A:
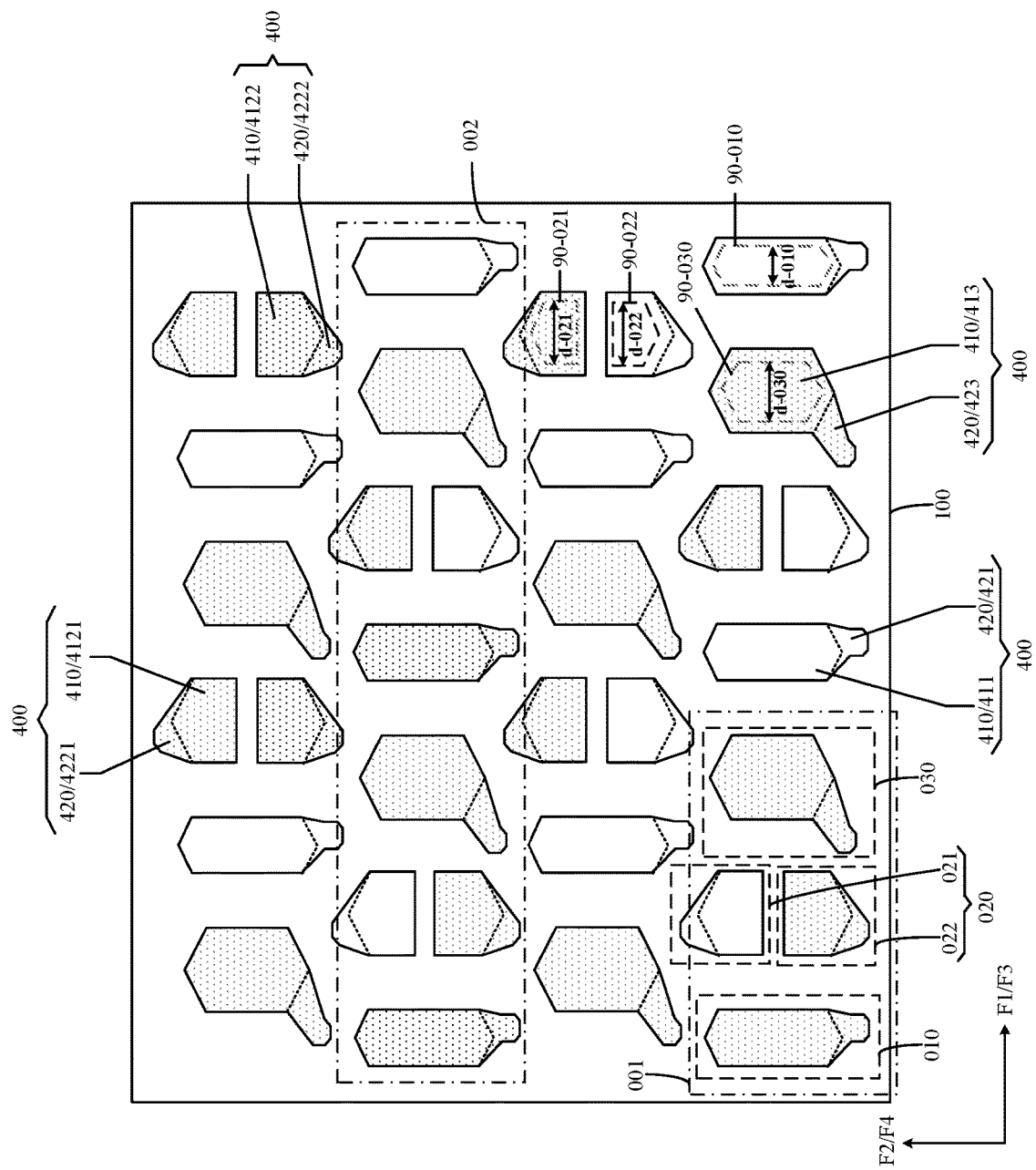
FIG. 4a is a schematic structural diagram of a top view of an anode provided by an embodiment of the present disclosure.

It should be noted that, as shown in FIGS. 3 and 4a, shaded areas in the first conductive layer 200 are solid portions defining a hollow pattern, and blank portions surrounded by the shaded areas in the first conductive layer 200 form the hollow pattern. The first insulating layer 300 of which orthographic projection overlapping orthographic projections of the solid portions on the substrate is spaced apart from the solid portions by a first conductive layer; and the first insulating layer 300 of which orthographic projection overlapping orthographic projections of the blank portions on the substrate is directly provided on the substrate, that is, the first insulating layer 300 whose orthographic projection overlapping the orthographic projections of the blank portions on the substrate is directly disposed on an insulating layer on the substrate.

Figure 5A:
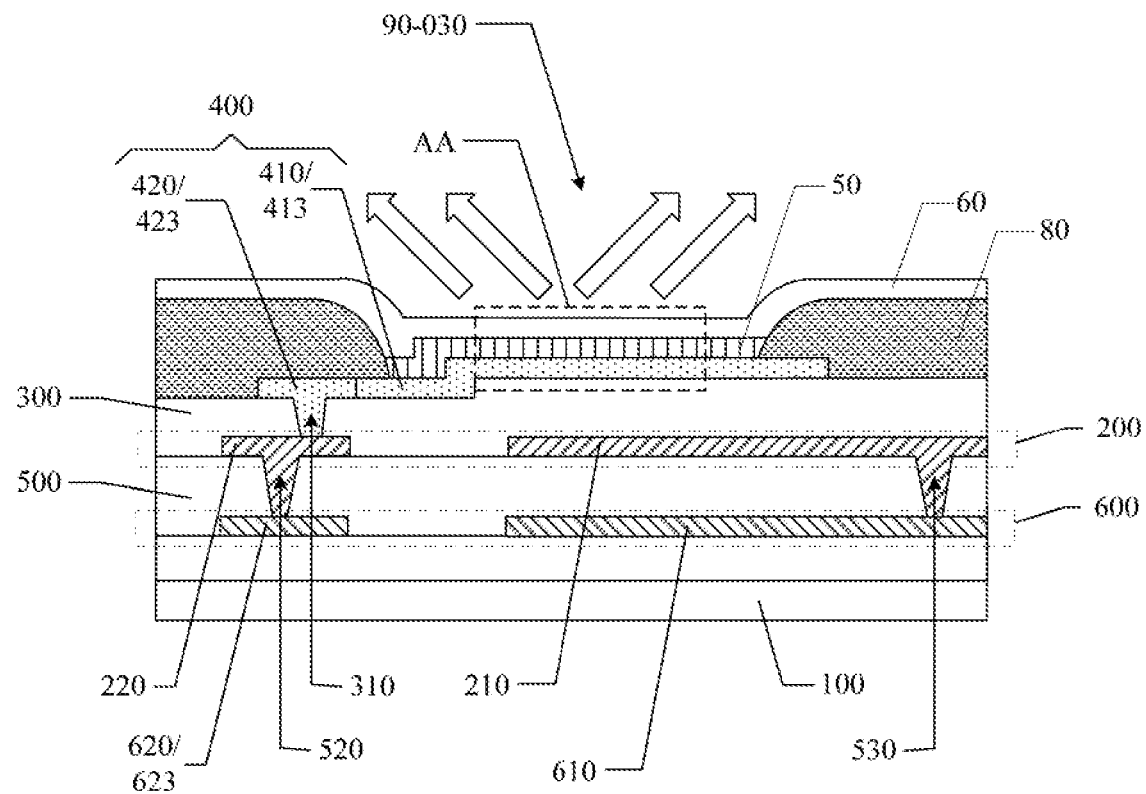
FIG. 5a is a schematic structural diagram of a sectional view of the electroluminescent display panel taken along the line AA' as indicated in FIG. 3.
Figure 5B:
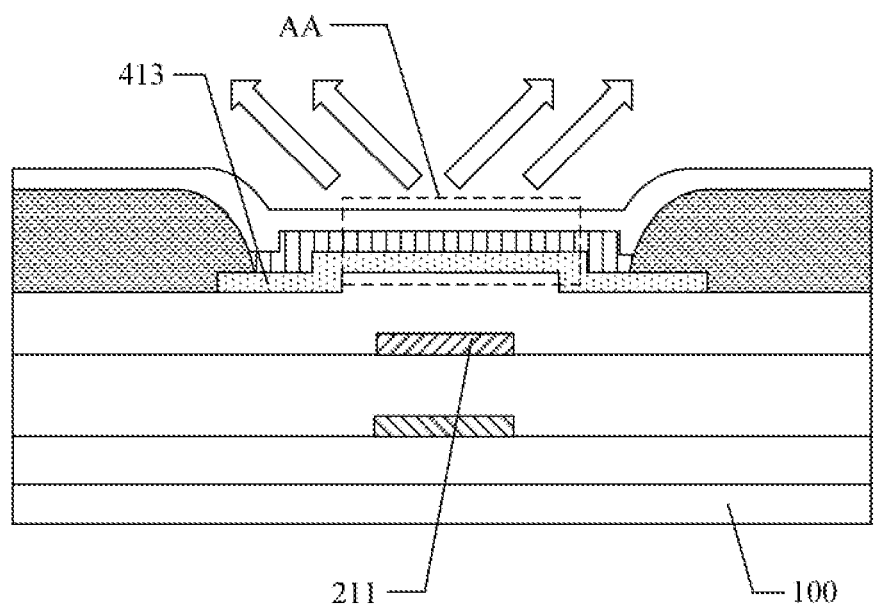
FIG. 5b is schematic structural diagram of a sectional view of the electroluminescent display panel taken along the line BB' as indicated in FIG. 3.

In some embodiments, in an embodiment of the present disclosure, as shown in FIGS. 3, 4a and 5a, each sub-pixel may further include a pixel defining layer 80 on a side of the anode 400 facing away from the substrate 100, a light emitting layer 50 on a side of the anode 400 facing away from the substrate 100, and a cathode 60 on a side of the anode facing away from the light emitting layer 50. The pixel defining layer 80 has an opening, and the opening exposes at least an area of the main body 410 of the anode 400; the light emitting layer 50 is located in the opening and is in contact with the main body 410 in area exposed by the opening; and an area of the opening where the light emitting layer 50 is located is used to emit light, so that an effective light emitting area 90 can be defined by the opening. That is to say, an area of the opening of the pixel defining layer 80 overlapping the main body 410 of the anode 400 is an effective light emitting area 90 of the sub-pixel. Exemplarily, an area of the opening of the pixel defining layer 80 in the third-color sub-pixel 030 overlapping the main body 413 of the anode 400 is an effective light emitting area 90-030 of the third-color sub-pixel 030. An area of the opening of the pixel defining layer 80 in the first-color sub-pixel 010 overlapping the main body 411 of the anode 400 is an effective light emitting area 90-010 of the first-color sub-pixel 010. An area of the opening of the pixel defining layer 80 in a second-color sub-pixel 021 overlapping the main body 4121 of the anode 400 is an effective light emitting area 90-021 of the second-color sub-pixel 021. An area of the opening of the pixel defining layer 80 in a second-color sub-pixel 022 overlapping the main body 4122 of the anode 400 is an effective light emitting area 90-022 of the second-color sub-pixel 022. The auxiliary portion 420 of the second-color sub-pixel 021 can also be denoted as 4221, see FIG. 4a. The auxiliary portion 420 of the first-color sub-pixel 010 can also be denoted as 421, see FIG. 6.

It should be noted that, in embodiments of the present disclosure, each light emitting layer may include an electroluminescent layer and other common layers disposed on two sides of the electroluminescent layer, such as a hole injection layer, a hole transport layer, an electron injection layer, and an electron transport layer, but in the drawings of the present disclosure, only the electroluminescent layer in the light emitting layer is shown, and other common layers are not shown. Exemplarily, the material of the electroluminescent layer may include an organic electroluminescent material, and thus the electroluminescent display panel may be an OLED display panel. Alternatively, the material of the electroluminescent layer may also include a quantum dot electroluminescent material, and thus the electroluminescent display panel may be a quantum dot light emitting diode (QLED) display panel.

It should be noted that the central area AA of the main body 410 may be the effective light emitting area defined by the opening of the pixel defining layer. Thus, the entire effective light emitting area may form a transitional gentle slope to an edge of the main body 410, so that the effective light emitting area is approximately flat, thereby improving or even eliminating the color cast phenomenon of the display panel. Alternatively, the central area AA of the main body 410 is smaller than the effective light emitting area defined by the pixel defining layer. For example, the central area AA of the main body 410 may be an area where the center of the effective light emitting area defined by the pixel defining layer is located. Thus, the central area AA of the main body 410 may form a transitional gentle slope to the edge of the main body 410, so that the central area AA of the main body 410 is approximately flat, thereby improving or even eliminating the color cast phenomenon of the display panel.

Of course, the portion of the hollow pattern of which the orthographic projection overlapping the orthographic projection of the main body on the substrate is configured to enable the main body to be substantially flat, so that the entire main body may be substantially flat, thereby further improving or even eliminating the color cast phenomenon of the display panel.

In some embodiments, in an embodiment of the present disclosure, as shown in FIG. 3, the overlapping area between the main body 413 of the third-color sub-pixel 030 and the first conductive layer 200 is larger than the sum of the overlapping area between the main body of the second-color sub-pixel and the first conductive layer 200 and the overlapping area between the main body 411 of the first-color sub-pixel 010 and the first conductive layer 200.

In some embodiments, in an embodiment of the present disclosure, as shown in FIGS. 3 and 4a, the main body 400 in at least one sub-pixel may have at least one symmetry axis, and an orthographic projection of the main body 400 on the substrate 100 overlaps an orthographic projection of the first conductive layer 200 on the substrate 100. Furthermore, an area ratio of the first conductive layer 200 of which orthographic projection overlapping the orthographic projection of the main body 400 of the at least one sub-pixel on the substrate 100, on two sides of the at least one symmetry axis is within a range of 1±0.1. Exemplarily, the area ratio may be 1.1. Or the area ratio may also be 0.9. Or the area ratio may also be 1.05 or 1.

In some embodiments, in an embodiment of the present disclosure, as shown in FIGS. 3 and 4a, the first conductive layer 200 of which orthographic projection overlapping the orthographic projection of the main body 400 of the at least one sub-pixel on the substrate 100 is substantially axisymmetric about the at least one symmetry axis. That is to say, the area ratio of the first conductive layer 200 of which orthographic projection overlapping the orthographic projection of the main body 400 of the at least one sub-pixel on the substrate 100, on the two sides of the at least one symmetry axis is approximately 1. Due to the limitation of process conditions, the above-mentioned ratio cannot be absolutely 1, so long as the above-mentioned conditions are approximately satisfied. Exemplarily, as shown in FIGS. 3 and 4a, using the main body 413 in one sub-pixel as an example, the main body 413 may have a first symmetry axis extending along a first direction F1, and the first conductive layer 200 of which orthographic projection overlapping the orthographic projection of the main body 413 on the substrate 100 may be arranged substantially axisymmetric about the first symmetry axis; and/or the main body 413 may have a second symmetry axis extending in a second direction F2, and the first conductive layer 200 of which orthographic projection overlapping the orthographic projection of the main body 413 on the substrate 100 may be arranged substantially axisymmetric about the second symmetry axis. Thus, at least the central area AA of the main body 413 may have a protrusion, and areas of the main body 413 on two sides of the first symmetry axis are arranged symmetrically and/or areas of the main body 413 on two sides of the second symmetry axis are arranged symmetrically, so that the asymmetry of the main body 413 may be reduced. In this way, the asymmetry of light emission in the effective light emitting area may be improved or even eliminated, thereby improving or even eliminating the color cast phenomenon of the display panel.

In some embodiments, in an embodiment of the present disclosure, as shown in FIGS. 3 and 4a, the first conductive layer 200 may include a first power line 210 and a first connection line 220 spaced apart from each other; and where in each sub-pixel, the auxiliary portion 420 is electrically connected to the first connection line 220 through the first via hole 310. Further, the first power line 210 may be a power line configured to transmit a driving voltage. It should be noted that FIG. 3 only shows the first connection line 220 in one third-color sub-pixel 030, and the first connection lines in other sub-pixels may be designed and determined according to the actual application environment, and which is not described herein.

Generally in the display field, one pixel usually includes a plurality of sub-pixels, each of which may display a single color (such as red, green or blue) respectively, and proportions of the sub-pixels of different colors are controlled to display different colors, so the above-mentioned sub-pixels may be single-color sub-pixels. In some embodiments, in an embodiment of the present disclosure, as shown in FIGS. 3 and 4a, each of the plurality of repeating units 001 may include one first-color sub-pixel 010, one second-color sub-pixel pair 020 and one third-color sub-pixel 030 arranged in a third direction F3. The second-color sub-pixel pair 020 may include two second-color sub-pixels 021, 022 arranged in a fourth direction F4. The first-color sub-pixel 010 is configured to emit light of a first color, the second-color sub-pixels 021, 022 are configured to emit light of a second color, and the third-color sub-pixel is configured to emit light of a third color. In some examples, the first color, the second color and the third color may be selected from red, green and blue. For example, the first color is red, the second color is green, and the third color is blue. Therefore, the repeating unit 001 has an arrangement structure of red, green and blue sub-pixels. Of course, embodiments of the present disclosure include but are not limited this. The above-mentioned first color, second color and third color may also be other colors.

Alternatively, for example, repeating units in adjacent repeating unit groups are staggered from each other along the third direction F3, that is, adjacent repeating units in adjacent repeating unit group have a certain offset from each other along the third direction F3. Therefore, sub-pixels of the same color in adjacent repeating unit groups are not aligned in the third direction F3. In some examples, the offset between sub-pixels of the same color in adjacent repeating unit groups in the third direction F3 may be half the size of the repeating unit in the third direction F3. For example, the size of the repeating unit in the third direction F3 may be a interval between the repeating unit in the third direction F3.

In some embodiments, in an embodiment of the present disclosure, as shown in FIGS. 3 and 4a, as the second-color sub-pixel pair 020 may include two second-color sub-pixels 021, 022 arranged along the fourth direction F4, during preparation of a light emitting layer by an FMM evaporation process, light emitting layers of the two second-color sub-pixels 021 and 022 in each second-color sub-pixel pair 020 may be connected to form a light emitting layer of the two second-color sub-pixels 021, 022 in the second-color sub-pixel pair 020 by an evaporation hole of an FMM. If the second-color is green, the process difficulty of preparing a light emitting layer of a green sub-pixel may be reduced to some extent.

In addition, although the shape of the main body of each sub-pixel in the drawing includes a corner strictly formed by two line segments, in some embodiments, the shape of the effective light emitting area of each sub-pixel may be a rounded corner. That is to say, based on the above-mentioned various graphic shapes, the corners of the effective light emitting areas of the sub-pixels are rounded. For example, in the case where the light emitting layer is evaporated by a mask, a portion of the light emitting layer at a corner may naturally form a rounded-corner shape.

In some examples, as shown in FIGS. 3 and 4a, the shapes of the main bodies of the first-color sub-pixel 010 and the third-color sub-pixel 030 may be a hexagon, and three pairs of opposite sides of the hexagon are parallel. The shape of the main body of each second-color sub-pixel 021, 022 may be a pentagon, and the pentagon includes two sides that are not crossed at a right angle, a pair of parallel opposite sides, and a vertical side, the vertical side being perpendicular to the pair of parallel opposite sides, and the two sides that are not crossed at a right angle being connected between the pair of parallel opposite sides, where the vertical sides of the second-color sub-pixels 021, 022 in each second-color sub-pixel pair 020 are adjacent to each other.

In some examples, as shown in FIGS. 3 and 4a, a pair of longer parallel opposite sides in the main body of the first-color sub-pixel 010 and a pair of longer parallel opposite sides in the main body of the third-color sub-pixel 030 are respectively parallel to the pair of parallel opposite sides of the main body of the second-color sub-pixels 021, 022. Further, exemplarily, a pair of longer parallel opposite sides in the effective light emitting area 90-010 of the first-color sub-pixel 010 and a pair of longer parallel opposite sides in the effective light emitting area 90-030 of the third-color sub-pixel 030 are respectively parallel to a pair of parallel opposite sides in the effective light emitting areas 90-021, 90-022 of the second-color sub-pixels 021, 022.

In some examples, as shown in FIGS. 3 and 4a, the area of the first-color sub-pixel 010 is larger than that of one second-color sub-pixel 020, and the area of the third-color sub-pixel 030 is larger than that of one second-color sub-pixel 020. For example, the area of the effective light emitting area 90-010 of the first-color sub-pixel 010 is larger than the area of the effective light emitting area 90-021, 90-022 of one second-color sub-pixel 020, and the area of the effective light emitting area 90-030 of the third-color sub-pixel 030 is larger than the area of the effective light emitting area 90-021, 90-022 of one second-color sub-pixel 020.

In some embodiments, in an embodiment of the present disclosure, as shown in FIG. 3 and FIG. 4a, a staggered distance in the third direction F3 between two repeating units adjacent in the fourth direction F4 is greater than one or a combination of a maximum span of the first-color sub-pixel 010, a maximum span of the second-color sub-pixel 021, a maximum span of the second-color sub-pixel 022, and a maximum span of the third-color sub-pixel 030. For example, a staggered distance in the third direction F3 between two adjacent repeating units in the second direction F1 is greater than one or a combination of a maximum span d010 of the effective light emitting area 90-010 of the first-color sub-pixel 010, a maximum span d020 of the effective light emitting area 90-021 of the second-color sub-pixel 021, a maximum span d020 of the effective light emitting area 90-022 of the second-color sub-pixel 022, and a maximum span d030 of the effective light emitting area 90-030 of the third-color sub-pixel 030.

In some embodiments, in an embodiment of the present disclosure, as shown in FIGS. 3 and 4a, in one repeating unit 001, a farthest distance in the fourth direction F4, of the second-color sub-pixel 021 and the second-color sub-pixel 022 in the second-color sub-pixel pair 020 is greater than a farthest distance in the fourth direction F4, of any two points of the first-color sub-pixel 010. For example, in one repeating unit 001, a farthest distance in the fourth direction F4, of the effective light emitting area 90-021 of the second-color sub-pixel 021 and the effective light emitting area 90-022 of the second-color sub-pixel 022 in the second-color sub-pixel pair 020 is greater than a farthest distance in the fourth direction F4, of any two points of the effective light emitting area 90-010 of the first-color sub-pixel 010.

In some embodiments, in an embodiment of the present disclosure, as shown in FIGS. 3 and 4a, in a repeating unit 001, the farthest distance between the second-color sub-pixel 021 and the second-color sub-pixel 022 in the second-color sub-pixel pair 020 in the fourth direction F4 is greater than the farthest distance of any two points of the third-color sub-pixel 030 in the fourth direction F4. For example, in one repeating unit 001, a farthest distance in the fourth direction F4, of the effective light emitting area 90-021 of the second-color sub-pixel 021 and the effective light emitting area 90-022 of the second-color sub-pixel 022 in the second-color sub-pixel pair 020 is greater than a farthest distance in the fourth direction F4, of any two points of the effective light emitting area 90-030 of the third-color sub-pixel 030.

In some embodiments, in an embodiment of the present disclosure, as shown in FIGS. 3 and 4a, adjacent sub-pixels to a first-color sub-pixel do not include a first-color sub-pixel 010; adjacent sub-pixels to a second-color sub-pixel pair 020 do not include a second-color sub-pixel; and adjacent sub-pixels to a third-color sub-pixel 030 do not include a third-color sub-pixel 030.

In some embodiments, in an embodiment of the present disclosure, as shown in FIGS. 3 and 4a, in the third direction F3 and the fourth direction F4, two first-color sub-pixels 010 are spaced apart by other sub-pixels than first-color sub-pixels; two third-color sub-pixels 030 are spaced apart by other sub-pixels than third-color sub-pixels; and two second-color sub-pixels are spaced apart by other sub-pixels than second-color sub-pixels.

In some embodiments, in an embodiment of the present disclosure, as shown in FIGS. 3 and 4a, two adjacent repeating units in the second direction F1 are arranged as a repeating group. Exemplarily, in the same repeating group, the second-color sub-pixel pair 020 in one repeating unit is between a maximum span in the third direction F3, of the first-color sub-pixel 010 and the third-color sub-pixel 030 in the other repeating unit. For example, in the same repeating group, the effective light emitting area of the second-color sub-pixel pair 020 in one repeating unit is between a maximum span in the third direction F3, of the effective light emitting area of the first-color sub-pixel 010 and the effective light emitting area of the third-color sub-pixel 030 in the other repeating unit.

In some embodiments, in an embodiment of the present disclosure, as shown in FIGS. 3 and 4a, two adjacent repeating units in the fourth direction F4 are arranged as a repeating group. Exemplarily, in the same repeating group, the first-color sub-pixel 010 in one repeating unit is between a maximum span in the third direction F3, of the second-color sub-pixel pair 020 and the third-color sub-pixel 030 in the other repeating unit. For example, in the same repeating group, the effective light emitting area of the first-color sub-pixel 010 in one repeating unit is between a maximum span in the third direction F3, of the effective light emitting area of the second-color sub-pixel pair 020 and the effective light emitting area of the third-color sub-pixel 030 in the other repeating unit.

In some embodiments, in an embodiment of the present disclosure, as shown in FIGS. 3 and 4a, two adjacent repeating units in the third direction F3 are arranged as a repeating group. Exemplarily, in the same repeating group, the third-color sub-pixel 030 in one repeating unit is between a maximum span in the third direction F3, of the second-color sub-pixel pair 020 and the first-color sub-pixel 010 in the other repeating unit. For example, in the same repeating group, the effective light emitting area of the third-color sub-pixel 030 in one repeating unit is between a maximum span in the third direction F3, of the effective light emitting area of the second-color sub-pixel pair 020 and the effective light emitting area of the first-color sub-pixel 010 in the other repeating unit.

In some embodiments, in an embodiment of the present disclosure, as shown in FIGS. 3 and 4a, in the same repeating unit 001, a minimum distance in the fourth direction F4, of the two second-color sub-pixels 021, 022 in the same second-color sub-pixel pair 020 is less than a maximum span in the fourth direction F4, of the first-color sub-pixel 010. For example, in the same repeating unit 001, a minimum distance in the fourth direction F4, of the effective light emitting area 90-021 of the second-color sub-pixel 021 and the effective light emitting area 90-022 of the second-color sub-pixel 022 in the same second-color sub-pixel pair 020 is less than a maximum span d010 in the fourth direction F4, of the effective light emitting area 90-010 of the first-color sub-pixel 010.

In some embodiments, in an embodiment of the present disclosure, as shown in FIGS. 3 and 4a, in the same repeating unit 001, a minimum distance in the fourth direction F4, of the two second-color sub-pixels 021 and 022 in the same second-color sub-pixel pair 020 is smaller than a maximum span in the fourth direction F4, of the third-color sub-pixel 030. For example, in the same repeating unit 001, a minimum distance in the fourth direction F4, of the effective light emitting area 90-021 of the second-color sub-pixel 021 and the effective light emitting area 90-022 of the second-color sub-pixel 022 in the same second-color sub-pixel pair 020 is less than a maximum span d030 in the fourth direction F4, of the effective light emitting area 90-030 of the third-color sub-pixel 030.

In some embodiments, in an embodiment of the present disclosure, as shown in FIG. 3 and FIG. 4a, the sub-pixels in the repeating units in odd-numbered repeating unit groups are arranged in the same manner, and the sub-pixels in the repeating units in even-numbered repeating unit groups are arranged in the same manner. For example, except for an edge portion of a display area of the substrate, a connecting line of the centers of two green sub-pixels in each repeating unit is located between the centers of two adjacent red and blue sub-pixels in adjacent repeating unit groups. In addition, edges of the above-mentioned two green sub-pixels are at the inner sides of outer edges of the two adjacent red and blue sub-pixels. The outer edges here refer to edges of the two sub-pixels opposite to each other in the fourth direction F4. That is to say, in the fourth direction F4, an extension range of one green sub-pixel pair in the fourth direction F4 is not greater than an extension range of the above-mentioned two adjacent red and blue sub-pixels in the fourth direction F4. In addition, in embodiments of the present disclosure, unless otherwise specified, the "center" of a sub-pixel refers to a geometric center of the shape of the sub-pixel (for example, a first-color sub-pixel, second-color sub-pixel or third-color sub-pixel).

It should be noted that, in designing of an arrangement structure of sub-pixels, the sub-pixels are generally designed into a regular shape, such as a hexagon, pentagon, trapezoid or other shape. In designing, the center of a sub-pixel may be a geometric center of the above-mentioned regular shape. However, in an actual manufacturing process, the shape of a formed sub-pixel generally has a deviation from the regular shape in the above-mentioned design. For example, corners of the above-mentioned regular shape may become rounded corners, and therefore, the shape of the sub-pixel may be a rounded-corner shape. In addition, the shape of an actually manufactured sub-pixel may also have other changes from the designed shape. For example, the shape of a sub-pixel designed as a hexagon may become approximately elliptical in actual manufacturing. Therefore, the center of a sub-pixel may be not a strict geometric center of the irregular shape of the formed sub-pixel. In an embodiment of the present disclosure, the center of a sub-pixel may be offset from a geometric center of the shape of the sub-pixel. The center of a sub-pixel refers to any point in an area enclosed by specific points on radiation line segments starting from the geometric center of the sub-pixel to points of edges of the sub-pixel, wherein the specific points on the radiation line segments are at ⅓ of the lengths of the radiant line segments from the geometric center. The definition of the center of a sub-pixel applies to the center of the shape of a sub-pixel with a regular shape, and also applies to the center of a sub-pixel with an irregular shape.

In some embodiments, in an embodiment of the present disclosure, as shown in FIGS. 3 and 4a, in every adjacent three repeating unit groups, the three adjacent columns include a first row, a second row, and a third row successively along a column direction (i.e. the fourth direction F4), and a minimum distance in the row direction between the centers of the two second-color sub-pixels 021, 022 in the second-color sub-pixel pair 020s in the second row is shorter than a minimum distance in the row direction between the centers of the first-color sub-pixels 010 in the first row and the between the centers of the first-color sub-pixels 010 in the third row.

In some embodiments, in an embodiment of the present disclosure, as shown in FIGS. 3 and 4a, sides of first-color sub-pixels 010 in the third direction F3 and sides of third-color sub-pixels 030 in the third direction F3 are arranged in parallel.

In some embodiments, in an embodiment of the present disclosure, as shown in FIGS. 3 and 4a, in each repeating unit 001, the first-color sub-pixel 010, the second-color sub-pixel pair 020 and the third-color sub-pixel 030 are arranged in the same order.

In some embodiments, in an embodiment of the present disclosure, as shown in FIGS. 3 and 4a, in at least one sub-pixel, the ratio of the size of the main body 400 in the fourth direction F4 to the size of the main body 400 in the third direction F3 is γ1, and the value range of γ1 is 1.2-3. Exemplarily, γ1 of a blue sub-pixel may be 1.5-1.7. For example, γ1 of a blue sub-pixel may be 1.5, 1.6 or 1.7. Exemplarily, γ1 of a red sub-pixel may be 2.2-2.6. For example, γ1 of a red sub-pixel may be 2.2, 2.3, 2.4, 2.5 or 2.6. Of course, in practical applications, γ1 of the above sub-pixels can also be designed and determined according to the actual application environment, which is not limited herein.

In some embodiments, in an embodiment of the present disclosure, as shown in FIGS. 3 to 5a, the electroluminescent display panel may further include a second insulating layer 500 between the first conductive layer 200 and the substrate 100, and a second conductive layer 600 between the second insulating layer 500 and the substrate 100, wherein the second conductive layer 600 may include a second power line 610 and a second connection line 620 spaced apart from each other. The second insulating layer 500 has a second via hole 520 exposing the second connection line 620, and a third via hole 530 exposing a portion of the second power line 610. Furthermore, the first power line 210 is electrically connected with the second power line 610 through the third via hole 530 to achieve a resistance reducing effect. The first connection line 220 is electrically connected with the second connection line 620 through the second via hole 520, and the second connection line 620 is electrically connected with a drain of a transistor in the driving circuit to achieve signal transmission. It should be noted that the above description is based on the third-color sub-pixel as an example, and the configuration in other sub-pixels may be deduced by analogy, which will not be repeated herein. The second connection line 620 in the third-color sub-pixel 030 can also be denoted as 623, see FIG. 5a and FIG. 14b. The second connection line 620 in the first-color sub-pixel 010 can also be denoted as 621, see FIG. 6. The second connection line 620 in the second-color sub-pixel 021 can also be denoted as 6221, see FIG. 7b. The second connection line 620 in the second-color sub-pixel 022 can also be denoted as 6222, see FIG. 8b.

In some embodiments, in an embodiment of the present disclosure, as shown in FIGS. 3, 5a, 6, 7b and 8b, for the first connection line 220 and the second connection line 620 that are electrically connected with each other, an orthographic projection of the first connection line 220 on the substrate 100 at least partially overlaps an orthographic projection of the second connection line 620 on the substrate 100. In some embodiments, the orthographic projection of the first connection line 220 on the substrate 100 at least partially overlaps the orthographic projection of the second connection line 620 on the substrate 100. In some embodiments, the orthographic projection of the first connection line 220 on the substrate 100 partially overlaps the orthographic projection of the second connection line 620 on the substrate 100. This can improve the effect of mutual electrical connection.

Figure 4B:
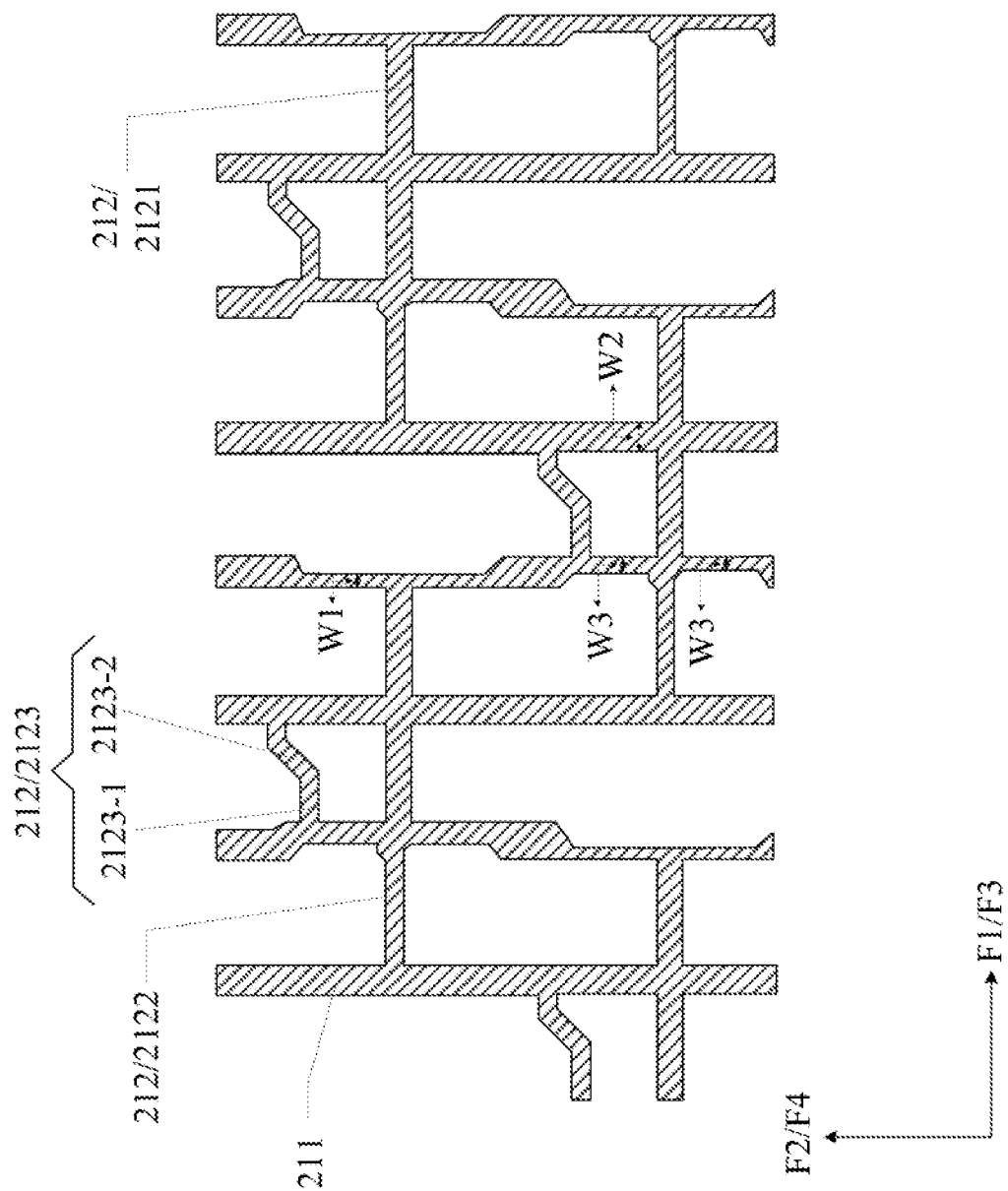
FIG. 4b is a first schematic structural diagram of a top view of a first conductive layer provided by an embodiment of the present disclosure.

In some embodiments, in an embodiment of the present disclosure, as shown in FIGS. 3 and 4b, the first power line 210 may include a plurality of sub-power lines 211 arranged in a first direction F1 and extending in a second direction F2, and conduction lines 212 electrically connecting the sub-power lines 211, wherein the first direction F1 is different from the second direction F2. Exemplarily, the first direction F1 is perpendicular to the second direction F2.

In some embodiments, in an embodiment of the present disclosure, as shown in FIGS. 3 and 4a, the third direction F3 may be same as the first direction F1, and the fourth direction F4 may be same as the second direction F2. Furthermore, the size of the main body 413 of the third-color sub-pixel 030 in the second direction F2 is larger than the size of the main body 413 of the third-color sub-pixel 030 in the first direction F1; and the size of the main body 411 of the first-color sub-pixel 010 in the second direction F2 is larger than the size of the main body 411 of the first-color sub-pixel 010 in the first direction F1. Exemplarily, the size of the main body 413 of the third-color sub-pixel 030 in the first direction F1 is larger than the size of the main body 411 of the first-color sub-pixel 010 in the first direction F1. The size of the main body 411 of the first-color sub-pixel 010 in the second direction F2 is larger than the size of the main body 413 of the third-color sub-pixel 030 in the second direction F2. Of course, embodiments of the present disclosure include but are not limited to this, and the relationships between the above-mentioned dimensions may also be in other forms.

In some embodiments, in an embodiment of the present disclosure, as shown in FIGS. 3 and 4a, the plurality of repeating units 001 are arranged in the third direction F3 to form repeating unit groups 002; the repeating unit groups 002 are arranged in the fourth direction F4; and the repeating units 001 in every two adjacent repeating unit groups 002 are arranged in a staggered manner. Exemplarily, the repeating units 001 in every two adjacent repeating unit groups 002 are staggered by the size of ½ repeating unit 001. It should be noted that the size of one repeating unit 001 described above may be the distance between the centers of sub-pixels of the same color in two adjacent repeating units 001 in the third direction F3. For example, the size of one repeating unit 001 described above may be the distance between the centers of first-color sub-pixels 010 in two adjacent repeating units 001 in the third direction F3.

In some embodiments, in an embodiment of the present disclosure, as shown in FIGS. 3 and 4a, the orthographic projection of the main body 413 in the third-color sub-pixel 030 on the substrate 100 does not overlap the orthographic projection of the first connection line 220 on the substrate 100. The orthographic projection of the main body 413 in the third-color sub-pixel 030 on the substrate 100 overlaps the orthographic projection of the first power line 210 on the substrate 100. Furthermore, the main body 413 in the third-color sub-pixel 030 may have a first symmetry axis in the first direction F1. Exemplarily, the shape of the main body 413 in the third-color sub-pixel 030 is substantially a hexagon or ellipse, wherein a short symmetry axis of the hexagon or a short axis of the ellipse is substantially parallel to the first direction F1, and a long symmetry axis of the hexagon or a long axis of the ellipse is substantially parallel to the second direction F2; and the short symmetry axis of the hexagon or the short axis of the ellipse may be used as the first symmetry axis. In some embodiments, in the third-color sub-pixel 030, the first power line 210 whose orthographic projection overlapping the orthographic projection of the main body 413 on the substrate 100 is substantially axisymmetric about the first symmetry axis, and the center of the first power line 210 whose orthographic projection overlapping the orthographic projection of the main body 413 on the substrate 100 substantially overlaps the center of the main body 413. Thus, the main body 413 may have a protrusion symmetric about the first symmetry axis, so that areas of the main body 413 on two sides of the first symmetry axis are symmetrically arranged, thereby reducing the asymmetry of the main body 413 and achieving flatness of the central area of the main body 413. In this way, the asymmetry of light emission in the effective light emitting area may be improved or even eliminated, thereby improving or even eliminating the color cast phenomenon of the display panel.

In some embodiments, in an embodiment of the present disclosure, as shown in FIGS. 3 and 4b, the conduction lines may include first conduction lines 2121. In the third-color sub-pixel 030, the orthographic projection of the main body 413 on the substrate 100 covers orthographic projections of at least one sub-power lines 211 and at least two first conduction lines 2121 on the substrate 100. Further, in the third-color sub-pixel 030, the sub-power line 211 whose orthographic projection overlapping the orthographic projection of the main body 413 on the substrate 100 is substantially axisymmetric about the first symmetry axis, and the sub-power line 211 whose orthographic projection overlapping the orthographic projection of the main body 413 on the substrate 100 covers the center of the main body 413. In addition, in the third-color sub-pixel 030, the main body 413 has a second symmetry axis in the second direction F2, and the long symmetry axis of the hexagon or the long axis of the ellipse may be used as the second symmetry axis. The at least two first conduction lines 2121 whose orthographic projections overlapping the orthographic projection of the main body 413 on the substrate 100 are substantially axisymmetric about the second symmetry axis. Thus, the entire first insulating layer may be raised by the sub-power lines 211 and the first conduction lines 2121, and substantial flatness of the main body 413 is further achieved on the basis of reducing the asymmetry of the main body 413, so that the light emitting layer is substantially flat, and the color cast phenomenon of the display panel is improved or even eliminated. It should be noted that the center in the present disclosure may be a geometric center of the corresponding structure.

In some embodiments, in an embodiment of the present disclosure, as shown in FIGS. 3 to 4b, in the third-color sub-pixel 030, the sub-power line 211 and the conduction lines 2121 whose orthographic projections overlapping the orthographic projection of the main body 413 on the substrate 100 adopts a cross-shaped configuration. Furthermore, the center of a cross-shaped structure formed by the sub-power line 211 and the first conduction lines 2121 in the orthographic projection overlaps the center of the main body 413. Exemplarily, the sub-power line 211 and the conduction lines 2121 whose orthographic projections overlapping the orthographic projection of the main body 413 on the substrate 100 may also adopt one of a pozidriv-shaped, a #-shaped, an I-shaped, an II-shaped and an III-shaped configuration. Of course, embodiments of the present disclosure include but are not limited to this, and the sub-power line 211 and the first conduction lines 2121 whose orthographic projections overlapping the orthographic projection of the main body 413 on the substrate 100 may also have other shapes.

In some embodiments, in an embodiment of the present disclosure, as shown in FIGS. 3 to 4b, the conduction lines may include second conduction lines 2122. One second conduction line 2122 is provided between the two second-color sub-pixels 021, 022 in the second-color sub-pixel pair 020. Furthermore, orthographic projections of the second-color sub-pixels 021, 022 on the substrate 100 do not overlap an orthographic projection of the second conduction line 2122 on the substrate 100. Exemplarily, the second conduction line 2122 extends linearly along the first direction F1. Further, the shape of the main bodies 413 in each second-color sub-pixel 021, 022 is substantially a pentagon, and a symmetry axis of the pentagon is substantially parallel to the second direction. Of course, embodiments of the present disclosure include but are not limited to this, and the shape of the main body 413 and the implementation of the second conduction line 2122 described above may also be other shapes.

In some embodiments, in an embodiment of the present disclosure, as shown in FIGS. 3 to 4b, for the third-color sub-pixel 030 and the second-color sub-pixel pair 020 in the same repeating unit 001, the first conduction lines 2121 whose orthographic projections overlapping the orthographic projection of the main body 413 of the third-color sub-pixel 030 on the substrate 100, and the second conduction line 2122 provided between the two second-color sub-pixels 021, 022 in the second-color sub-pixel pair 020 extend substantially on the same straight line along the first direction F1.

In some embodiments, in an embodiment of the present disclosure, as shown in FIGS. 3 to 4b, the conduction lines may include third conduction lines 2123; and one third conduction line 2123 is provided between a first-color sub-pixel 010 in a repeating unit group 002, and a third-color sub-pixel 030 that is in an adjacent repeating unit group 002 and nearest to the first-color sub-pixel 010. The third conduction line 2123 is disposed on a side of the main body 413 of the corresponding third-color sub-pixel 030 facing away from the auxiliary portion 423. Furthermore, the orthographic projection of the main body 411 of the first-color sub-pixel 010 on the substrate 100 and the orthographic projection of the main body 413 of the third-color sub-pixel 030 on the substrate 100 do not overlap an orthographic projection of the third conduction line 2123 on the substrate 100. Exemplarily, the third conduction line 2123 may be in at least one of a polyline shape and a curved shape. Of course, embodiments of the present disclosure include but are not limited to this, and the implementation of the third conduction line 2123 described above may also have other shapes.

In some embodiments, in an embodiment of the present disclosure, as shown in FIGS. 3 to 4b, the third conduction line 2123 may include a first conduction portion 2123-1 and a second conduction portion 2123-2 electrically connected with each other, wherein the first conduction portion 2123-1 extends in the first direction F1, and the second conduction portion 2123-2 extends in a direction intersecting the first direction F1. The extending direction of the second conduction portion 2123-2 and the extending direction of the first conduction portion 2123-1 are not perpendicular. For example, an angle of 45° may be formed therebetween.

In some embodiments, in an embodiment of the present disclosure, as shown in FIGS. 3 to 4b and FIG. 6, in the first-color sub-pixel 010, the size of an overlapping area between the orthographic projection of the main body 411 on the substrate 100 and the nearest sub-power line 211 is smaller than 80% of the width of the sub-power line 211 in the first direction F1. Exemplarily, further, the size of the overlapping area between the orthographic projection of the main body 411 on the substrate 100 and the nearest sub-power line 211 is smaller than one of 70%, 50% and 20% of the width of the sub-power line 211 in the first direction F1.

In some embodiments, in an embodiment of the present disclosure, as shown in FIGS. 3 to 4b and FIG. 6, in the first-color sub-pixel 010, the area of the orthographic projection of the main body 411 on the substrate 100 is smaller than 10% of the area of the main body 411. Exemplarily, further, the area of the orthographic projection of the main body 411 on the substrate 100 is smaller than one of 8%, 5%, and 2% of the area of the main body 411.

In some embodiments, in an embodiment of the present disclosure, as shown in FIGS. 3 to 4b and FIG. 6, in the first-color sub-pixel 010, the orthographic projection of the main body 411 on the substrate 100 does not overlap an orthographic projection of the first power line 210 on the substrate 100. That is, the orthographic projection of the main body 411 on the substrate 100 does not overlap an orthographic projection of the sub-power line 211 on the substrate 100, and the orthographic projection of the main body 411 on the substrate 100 does not overlap an orthographic projection of each conduction line 212 on the substrate 100. Thus, the main body 411 may be as flat as possible, and especially the part of the main body 411 located in the effective light emitting area is as flat as possible, so that the asymmetry of light emission of the effective light emitting area of the first-color sub-pixel 010 may be improved or even eliminated, thereby improving or even eliminating the color cast phenomenon of the display panel.

In some embodiments, in an embodiment of the present disclosure, as shown in FIGS. 3 to 4b, the main body 411 in the first-color sub-pixel 010 may have a third symmetry axis in the second direction F2. Exemplarily, the shape of the main body 411 in the first-color sub-pixel 010 is substantially a hexagon or ellipse, wherein a long symmetry axis of the hexagon or a long axis of the ellipse is substantially parallel to the second direction F2; and the long symmetry axis of the hexagon or the long axis of the ellipse may be used as the third symmetry axis. Of course, embodiments of the present disclosure include but are not limited this.

In some embodiments, in an embodiment of the present disclosure, as shown in FIGS. 3 to 4b and FIG. 6, at least a portion of the sub-power line 211 whose orthographic projection is nearest to the orthographic projection of the main body 411 of the first-color sub-pixel 010 has a first width W1, and the sub-power line 211 whose orthographic projection is covered by the orthographic projection of the main body 413 of the third-color sub-pixel 030 has a second width W2; and the first width W1 is smaller than the second width W2. Exemplarily, the sub-power line 211 whose orthographic projection is nearest to the orthographic projection of the main body 411 may have a first width W1, so that the sub-power line 211 may achieve avoidance so as to be disposed around the main body 411, and thus no sub-power line 211 is disposed below the main body 411, so that the main body 411 is as flat as possible, thereby improving or even eliminating the color cast phenomenon of the display panel. Furthermore, the width of the sub-power line 211 here may also be increased as much as possible, to further reduce the resistance.

In some embodiments, in an embodiment of the present disclosure, as shown in FIGS. 3 to 4b and FIG. 6, the widths of sub-power lines 211 on two sides of the long axis of the main body 411 of the first-color sub-pixel 010 are different, and the width of the sub-power line 211 nearer to the first-color sub-pixel 010 is smaller than the width of the sub-power line on the other side.

In some embodiments, in an embodiment of the present disclosure, as shown in FIGS. 3 to 4b and FIGS. 7a and 8a, in the second-color sub-pixel, the size of an overlapping area between the orthographic projection of the main body on the substrate and the nearest sub-power line is smaller than 80% of the width of the sub-power line in the first direction. Exemplarily, the size of an overlapping area between the orthographic projection of the main body 4121 in the second-color sub-pixel 021 on the substrate 100 and the nearest sub-power line 211 is smaller than 80% of the width of the sub-power line 211 in the first direction F1. For example, the size of the overlapping area between the orthographic projection of the main body 4121 on the substrate 100 and the nearest sub-power line 211 is smaller than one of 70%, 50% and 20% of the width of the sub-power line 211 in the first direction F1. Exemplarily, the size of an overlapping area between the orthographic projection of the main body 4122 in the second-color sub-pixel 022 on the substrate 100 and the nearest sub-power line 211 is smaller than 80% of the width of the sub-power line 211 in the first direction F1. For example, the size of the overlapping area between the orthographic projection of the main body 4122 on the substrate 100 and the nearest sub-power line 211 is smaller than one of 70%, 50% and 20% of the width of the sub-power line 211 in the first direction F1.

In some embodiments, in an embodiment of the present disclosure, as shown in FIGS. 3 to 4b and FIGS. 7a and 8a, in the second-color sub-pixel, the orthographic projection of the main body on the substrate is smaller than 10% of the area of the main body. Exemplarily, the orthographic projection of the main body 4121 in the second-color sub-pixel 021 on the substrate 100 is smaller than 10% of the area of the main body 4121. For example, the orthographic projection of the main body 4121 on the substrate 100 is smaller than one of 8%, 5% and 2% of the area of the main body 4121. Exemplarily, the orthographic projection of the main body 4122 on the substrate 100 is smaller than one of 8%, 5% and 2% of the area of the main body 4122.

In some embodiments, in an embodiment of the present disclosure, as shown in FIGS. 3 to 4b and FIGS. 7a and 8a, in the second-color sub-pixel, the orthographic projection of the main body on the substrate does not overlap orthographic projections of the first sub-power lines on the substrate. Exemplarily, the orthographic projection of the main body 4121 in the second-color sub-pixel 021 on the substrate 100 does not overlap orthographic projections of the sub-power lines 211 on the substrate 100, and the orthographic projection of the main body 4121 on the substrate 100 does not overlap orthographic projections of the conduction lines 212 on the substrate 100. Thus, the main body 4121 may be as flat as possible, and especially the part of the main body 4121 located in the effective light emitting area is as flat as possible, so that the asymmetry of light emission of the effective light emitting area of the second-color sub-pixel 021 may be improved or even eliminated, thereby improving or even eliminating the color cast phenomenon of the display panel. Moreover, the orthographic projection of the main body 4122 in the second-color sub-pixel 022 on the substrate 100 does not overlap orthographic projections of the sub-power lines 211 on the substrate 100, and the orthographic projection of the main body 4122 on the substrate 100 does not overlap orthographic projections of the conduction lines 212 on the substrate 100. Thus, the main body 4122 may be as flat as possible, and especially the part of the main body 4122 located in the effective light emitting area is as flat as possible, so that the asymmetry of light emission of the effective light emitting area of the second-color sub-pixel 022 may be improved or even eliminated, thereby improving or even eliminating the color cast phenomenon of the display panel.

Of course, the orthographic projection of the main body of the third-color sub-pixel on the substrate may also not overlap orthographic projections of the first power lines on the substrate. Furthermore, the orthographic projection of the main body in the second-color sub-pixel on the substrate does not overlap orthographic projections of the first sub-power lines on the substrate. Moreover, the orthographic projection of the main body in the third-color sub-pixel on the substrate does not overlap orthographic projections of the first power lines on the substrate. This may achieve that in each sub-pixel, the orthographic projection of the main body on the substrate does not overlap an orthographic projection of the second conductive layer on the substrate. Thus, each main body may be as flat as possible, so that the color cast phenomenon of the display panel may be improved or even eliminated.

In some embodiments, in an embodiment of the present disclosure, as shown in FIGS. 3 to 4b, at least a portion of the sub-power line whose orthographic projection is nearest to the orthographic projection of the main body of the second-color sub-pixel has a third width, and the third width is smaller than the second width. Exemplarily, at least a portion of the sub-power line 211 whose orthographic projection is nearest to a side of the orthographic projection of the main body 4121 of the second-color sub-pixel 021 has a third width W3, and W3<W2. For example, the sub-power line 211 whose orthographic projection surrounds a side of the orthographic projection of the main body 4121 of the second-color sub-pixel 021 has a third width W3. In this way, the sub-power line 211 may achieve avoidance so as to be disposed around the main body 4121, and thus no sub-power line 211 is disposed below the main body 4121, so that the main body 4121 is as flat as possible, thereby improving or even eliminating the color cast phenomenon of the display panel. Furthermore, the width of the sub-power line 211 here may also be increased as much as possible, to further reduce the resistance.

Moreover, at least a portion of the sub-power line 211 whose orthographic projection is nearest to a side of the orthographic projection of the main body 4122 of the second-color sub-pixel 022 has a third width W3, and W3<W2. For example, the sub-power line 211 whose orthographic projection surrounds a side of the orthographic projection of the main body 4122 of the second-color sub-pixel 022 has a third width W3. In this way, the sub-power line 211 may achieve avoidance so as to be disposed around the main body 4122, and thus no sub-power line 211 is disposed below the main body 4122, so that the main body 4122 is as flat as possible, thereby improving or even eliminating the color cast phenomenon of the display panel. Furthermore, the width of the sub-power line 211 here may also be increased as much as possible, to further reduce the resistance.

Generally, the insulating layer is provided with via holes, and to avoid the influence of the via holes on the main body, in some embodiments, in an embodiment of the present disclosure, as shown in FIGS. 3 and 4a, in the same sub-pixel, the orthographic projection of the main body on the substrate does not overlap an orthographic projection of the first via hole 310 on the substrate 100. For example, an orthographic projection of an effective portion of the main body on the substrate may not overlap the orthographic projection of the first via hole 310 on the substrate 100, while an orthographic projection of a peripheral area of the main body on the substrate overlaps the orthographic projection of the first via hole 310 on the substrate 100, and the area of the overlapping area may be 30% of the area of the main body.

Exemplarily, an orthographic projection of the effective light emitting area 90-010 of the first-color sub-pixel 010 on the substrate may not overlap the orthographic projection of the first via hole 310 on the substrate 100. An orthographic projection of the effective light emitting area 90-030 of the third-color sub-pixel 030 on the substrate may also not overlap the orthographic projection of the first via hole 310 on the substrate 100. An orthographic projection of the effective light emitting area 90-021 of the second-color sub-pixel 021 on the substrate may also not overlap the orthographic projection of the first via hole 310 on the substrate 100. An orthographic projection of the effective light emitting area 90-022 of the second-color sub-pixel 022 on the substrate may also not overlap the orthographic projection of the first via hole 310 on the substrate 100.

Figure 6:
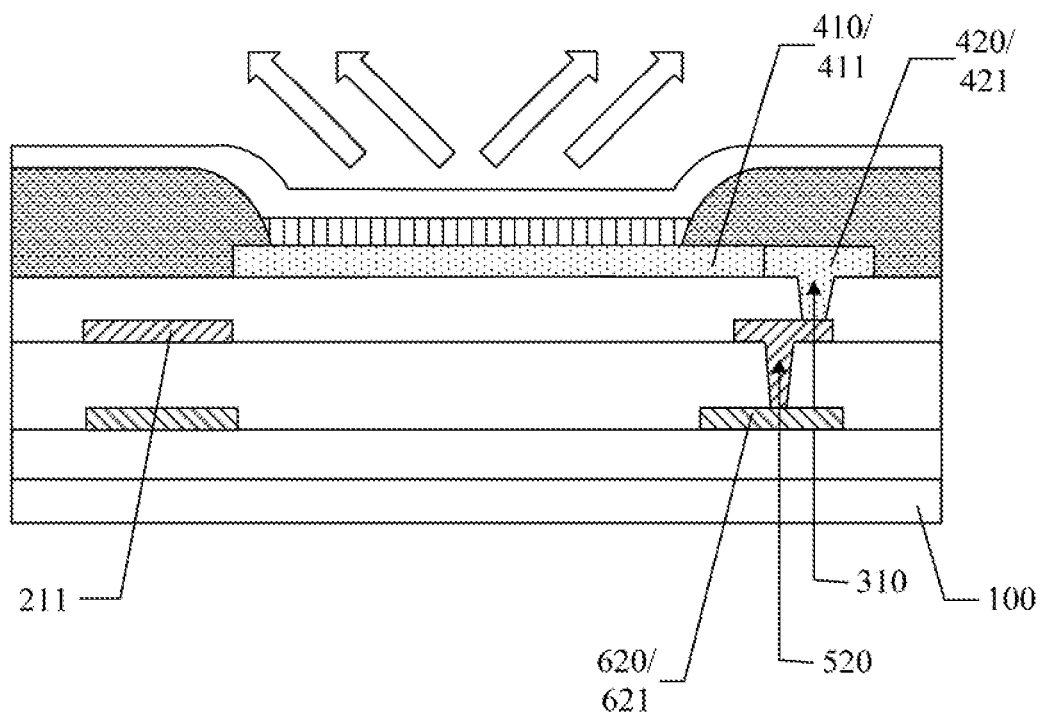
FIG. 6 is schematic structural diagram of a sectional view of the electroluminescent display panel taken along the line CC' as indicated in FIG. 3.
Figure 7A:
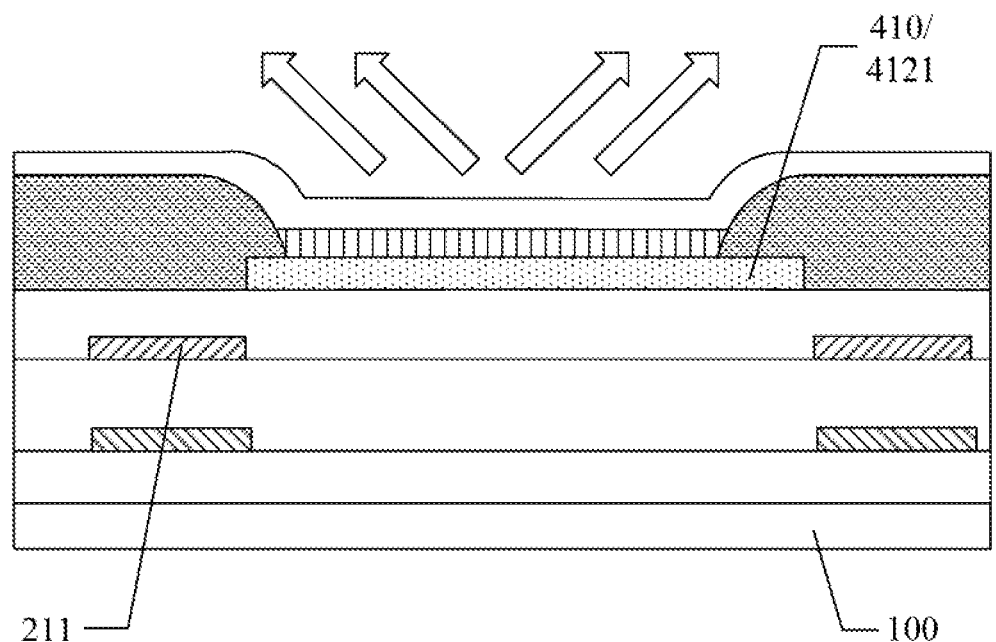
FIG. 7a is schematic structural diagram of a sectional view of the electroluminescent display panel taken along the line DD' as indicated in FIG. 3.
Figure 7B:
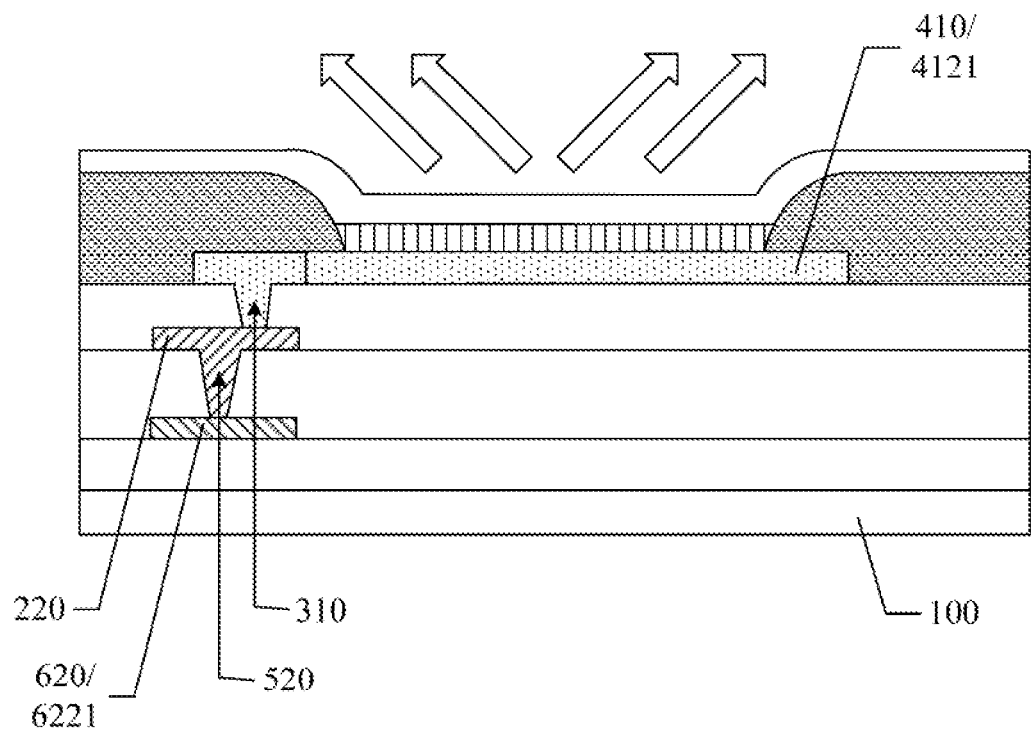
FIG. 7b is schematic structural diagram of a sectional view of the electroluminescent display panel taken along the line FF' as indicated in FIG. 3.
Figure 8A:
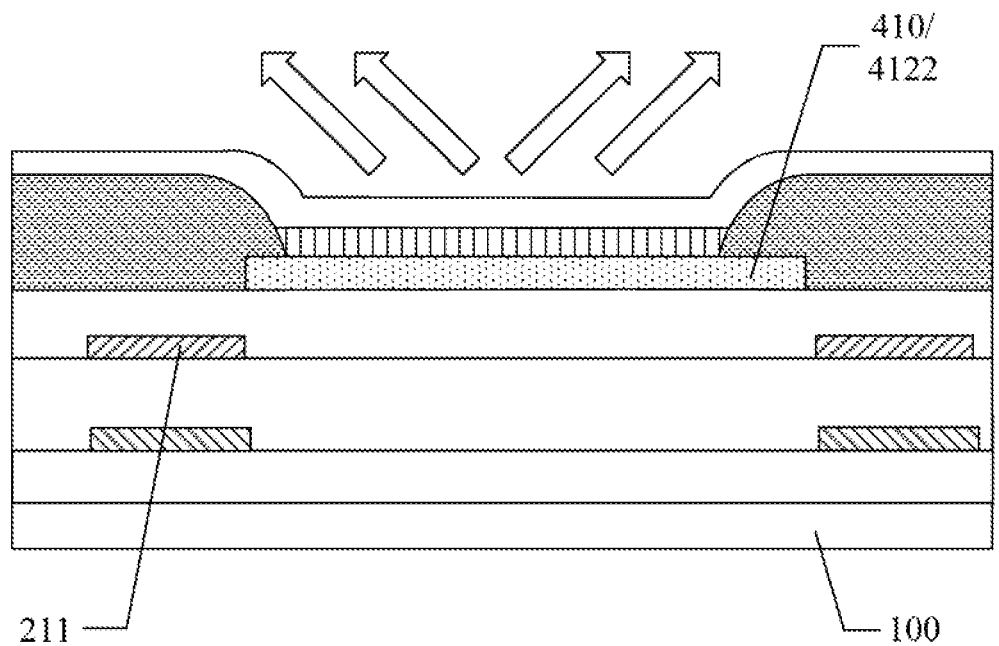
FIG. 8a is schematic structural diagram of a sectional view of the electroluminescent display panel taken along the line EE' as indicated in FIG. 3.
Figure 8B:
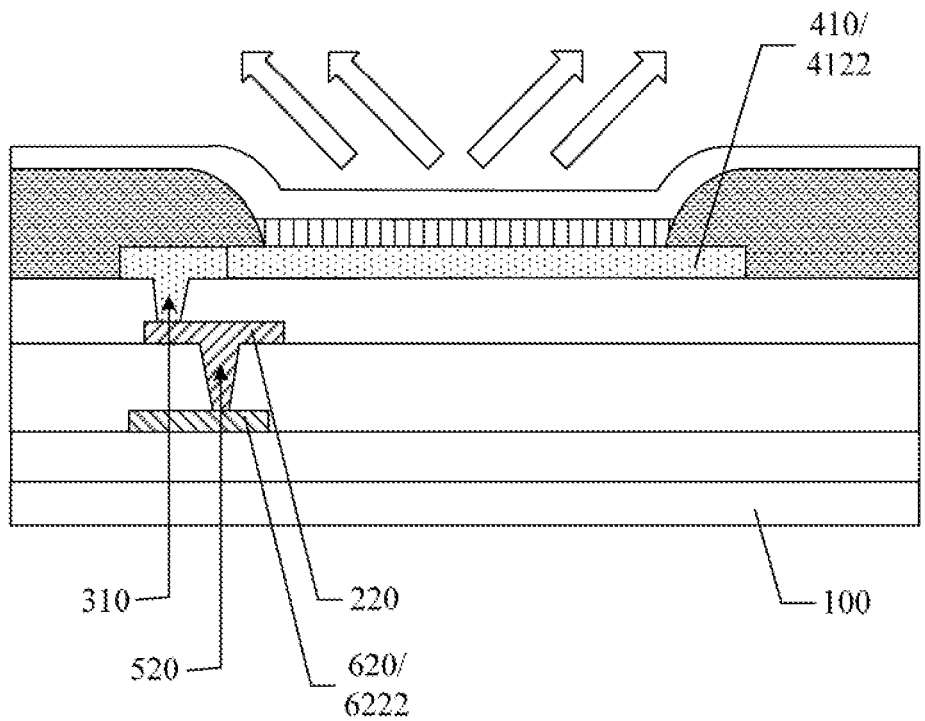
FIG. 8b is schematic structural diagram of a sectional view of the electroluminescent display panel taken along the line GG' as indicated in FIG. 3.

Exemplarily, referring to FIGS. 3, 4a and 6, in the first-color sub-pixel 010, the orthographic projection of the main body 411 on the substrate 100 does not overlap the orthographic projection of the first via hole 310 on the substrate 100. Referring to FIGS. 3, 4a and 5a, in the third-color sub-pixel 030, the orthographic projection of the main body 413 on the substrate 100 does not overlap the orthographic projection of the first via hole 310 on the substrate 100. Referring to FIGS. 3, 4a and 7b, in the second-color sub-pixel 021, the orthographic projection of the main body 4121 on the substrate 100 does not overlap the orthographic projection of the first via hole 310 on the substrate 100. Referring to FIGS. 3, 4a and 8b, in the second-color sub-pixel 022, the orthographic projection of the main body 4122 on the substrate 100 does not overlap the orthographic projection of the first via hole 310 on the substrate 100.

In some embodiments, in an embodiment of the present disclosure, as shown in FIGS. 3, 4a, 5a, 6, 7b and 8b, in the same sub-pixel, an orthographic projection of the second via hole 520 on the substrate 100 does not overlap the orthographic projection of the first via hole 310 on the substrate 100. In this way, the problem that the anode cannot be electrically connected to the second connection line due to excessive depths of the via holes can be avoided. For example, an orthographic projection of an effective portion of the second via hole 520 on the substrate may not overlap the orthographic projection of the first via hole 310 on the substrate 100, while an orthographic projection of a peripheral area of the second via hole 520 on the substrate overlaps an orthographic projection of a peripheral area of the first via hole 310 on the substrate 100, and the area of the overlapping area may be 30% of the area of the first via hole 310 or the second via hole 520.

In some embodiments, in an embodiment of the present disclosure, as shown in FIGS. 3 to 5a, in the third-color sub-pixel 030, the orthographic projection of the first via hole 310 on the substrate 100 is substantially close to the orthographic projection of the main body 413 on the substrate 100. Furthermore, in the second direction F2, the orthographic projection of the second via hole 520 on the substrate 100 is disposed on a side of the orthographic projection of the first via hole 310 on the substrate 100 away from the orthographic projection of the main body 413 on the substrate 100. Exemplarily, the first via hole 310 and the second via hole 520 are located at the lower left of the main body 413, and the second via hole 520 is located below the first via hole 310. In this way, a short circuit between an auxiliary portion 423 in a third-color sub-pixel 030 in an repeating unit group and the main body 411 in a first-color sub-pixel 010 that is in an adjacent repeating unit group and nearest to the third-color sub-pixel 030 may be avoided, and thus a short circuit phenomenon in the display panel may be reduced.

In some embodiments, in an embodiment of the present disclosure, as shown in FIGS. 3 to 4b and FIG. 6, in the first-color sub-pixel 010, the orthographic projection of the first via hole 310 on the substrate 100 is substantially away from the orthographic projection of the main body 411 on the substrate 100. Furthermore, in the second direction F2, the orthographic projection of the second via hole 520 on the substrate 100 is located between the orthographic projection of the first via hole 310 on the substrate 100 and the orthographic projection of the main body 411 on the substrate 100. Exemplarily, the first via hole 310 and the second via hole 520 are located at the lower right of the main body 411, and the first via hole 310 is located below the second via hole 520.

In some embodiments, in an embodiment of the present disclosure, as shown in FIGS. 3 to 4b and FIG. 7b, the orthographic projection of the first via hole 310 of the first second-color sub-pixel 021 in the second-color sub-pixel pair 020 on the substrate 100 is substantially close to the orthographic projection of the main body 4121 on the substrate 100, and in the second direction F2, the orthographic projection of the second via hole 520 on the substrate 100 is disposed on a side of the orthographic projection the first via hole 310 on the substrate 100 away from the orthographic projection of the main body 4121 on the substrate 100. Exemplarily, the first via hole 310 and the second via hole 520 are located at the upper left of the main body 4121, and the first via hole 310 is located below the second via hole 520.

In some embodiments, in an embodiment of the present disclosure, as shown in FIGS. 3 to 4b and FIG. 8b, the orthographic projection of the first via hole 310 of the second second-color sub-pixel 022 in the second-color sub-pixel pair 020 on the substrate 100 is substantially away from the orthographic projection of the main body 4122 on the substrate 100, and in the second direction F2, the orthographic projection of the second via hole 520 on the substrate 100 is located between the orthographic projection of the first via hole 310 on the substrate 100 and the orthographic projection of the main body 4122 on the substrate. Exemplarily, the first via hole 310 and the second via hole 520 are located at the lower left of the main body 4122, and the first via hole 310 is located below the second via hole 520.

In some embodiments, in an embodiment of the present disclosure, as shown in FIGS. 3 to 4b, for one repeating unit group 002, the first via holes 310 of the first-color sub-pixels 010 and the first via holes 310 of the second second-color sub-pixels 022 in the second color sub-pixel pairs 020, in the repeating unit group 002, and the first via holes 310 of the first second-color sub-pixels 021 in the second-color sub-pixel pairs 020 adjacent to the repeating unit group are arranged on the same straight line along the first direction F1. Exemplarily, the first via hole 310 of the first-color sub-pixel 010 and the first via hole 310 of the second second-color sub-pixel 022, in the second row of the repeating unit group 002, and the first via hole 310 of the first second-color sub-pixel 021 in the third row of the repeating unit group 002, the three first via hole 310 are arranged on the same straight line along the first direction F1 to reduce the design difficulty of a mask used in preparation of the three first via hole 310.

In some embodiments, in an embodiment of the present disclosure, as shown in FIGS. 3 to 4b, in the same repeating unit group 002, the first via holes 310 of the first-color sub-pixels 010, the first via holes 310 of the second second-color sub-pixels 022 in the second-color sub-pixel pairs 020, and the second via holes 520 of the third-color sub-pixels 030 are arranged on the same straight line along the first direction F1.

Figure 9:
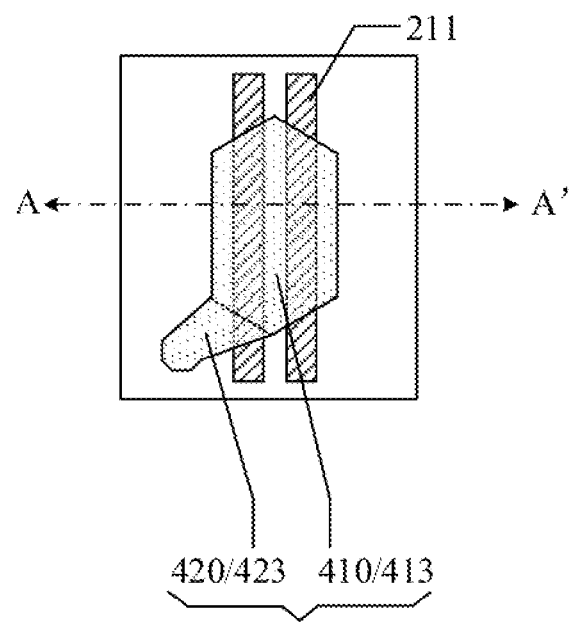
FIG. 9 is a second structural diagram of an electroluminescent display panel provided by an embodiment of the present disclosure.
Figure 10:
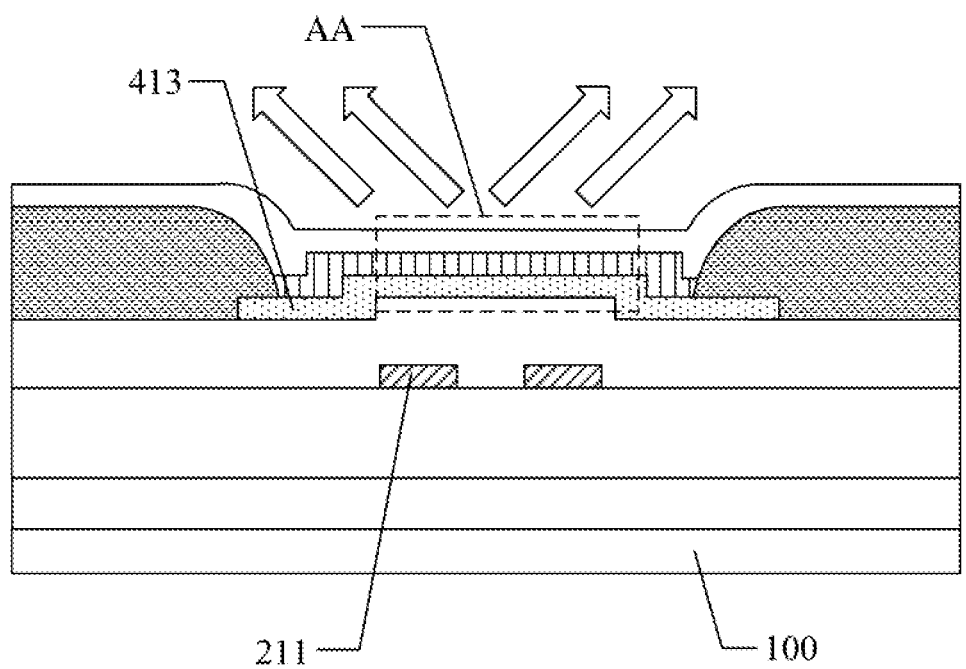
FIG. 10 is schematic structural diagram of a sectional view of the electroluminescent display panel taken along the line AA' as indicated in FIG. 9.

An embodiment of the present disclosure further provides schematic structural diagrams of some electroluminescent display panels, as shown in FIGS. 9 and 10, with modifications to the above implementation. Only differences between this embodiment and the above embodiment are described below, while similarities are not repeated herein. It should be noted that FIG. 9 only illustrates an implementation of a main body, an auxiliary portion and two sub-power lines in a third-color sub-pixel 030. For implementations of other film layers, reference may be made to the above embodiment, and details are not described herein.

In some embodiments, in an embodiment of the present disclosure, as shown in FIGS. 4a, 9 and 10, in the third-color sub-pixel 030, an orthographic projection of the main body 413 on the substrate 100 overlaps orthographic projections of at least two sub-power lines 211 on the substrate 100; and the at least two sub-power lines 211 whose orthographic projections overlapping the orthographic projection of the main body 413 on the substrate 100 are arranged in parallel and in equal interval. Further, the main body 413 has a second symmetry axis in the second direction F2; and in the third-color sub-pixel 030, the at least two sub-power lines 211 whose orthographic projections overlapping the orthographic projection of the main body 413 on the substrate 100 are disposed on two sides of the center of the main body 413 substantially axisymmetrically about the second symmetry axis. Exemplarily, the orthographic projection of the main body 413 on the substrate 100 covers the orthographic projections of the two sub-power lines 211 on the substrate 100. Thus, the sub-power lines 211 support the first insulating layer so that the main body 413 is as flat as possible, and the asymmetry of the main body 413 may be reduced. In this way, the asymmetry of light emission in the effective light emitting area may be improved or even eliminated, thereby improving or even eliminating the color cast phenomenon of the display panel.

Figure 11:
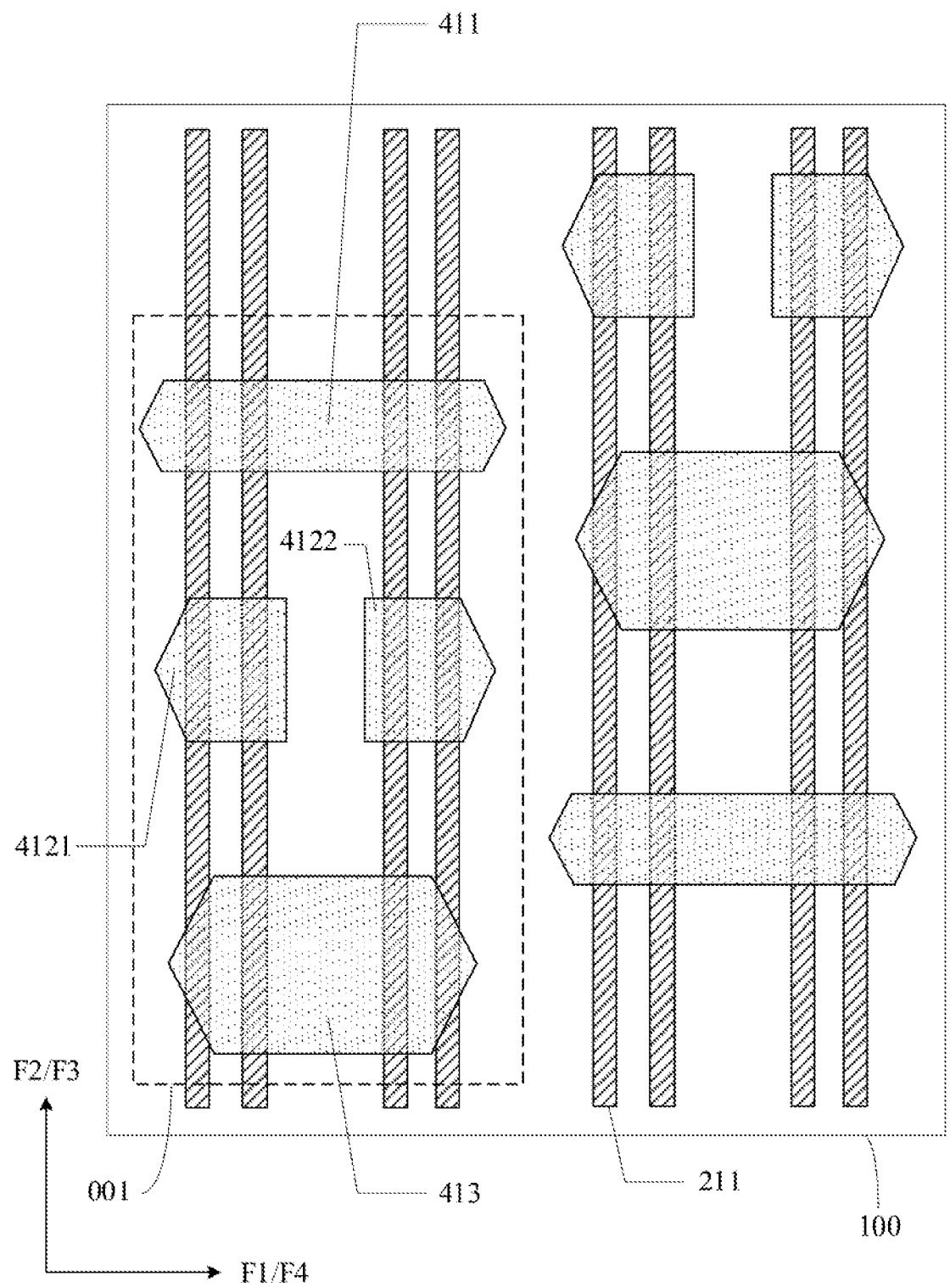
FIG. 11 is a third schematic structural diagram of an electroluminescent display panel provided by an embodiment of the present disclosure.

An embodiment of the present disclosure further provides schematic structural diagrams of some electroluminescent display panels, as shown in FIGS. 11 to 10, with modifications to the above implementation. Only differences between this embodiment and the above embodiment are described below, while similarities are not repeated herein.

In some embodiments, in an embodiment of the present disclosure, as shown in FIG. 11, the third direction F3 may also be same as the second direction F2, and the fourth direction F4 may be same as the first direction F1. The size of the main body 413 of the third-color sub-pixel 030 in the first direction F1 is larger than the size of the main body 413 of the third-color sub-pixel 030 in the second direction F2, and the size of the main body 411 of the first-color sub-pixel 010 in the first direction F1 is larger than the size of the main body 411 of the first-color sub-pixel 010 in the second direction F2. Exemplarily, the size of the main body 413 of the third-color sub-pixel 030 in the first direction F1 is smaller than the size of the main body 411 of the first-color sub-pixel 010 in the first direction F1. The size of the main body 411 of the first-color sub-pixel 010 in the second direction F2 is smaller than the size of the main body 413 of the third-color sub-pixel 030 in the second direction F2. Of course, embodiments of the present disclosure include but are not limited to this, and the relationships between the above-mentioned dimensions may also be in other forms.

In some embodiments, in an embodiment of the present disclosure, as shown in FIG. 11, in the first-color sub-pixel 010, an orthographic projection of the main body 411 on the substrate 100 overlaps orthographic projections of at least two sub-power lines 211 on the substrate 100; and the at least two sub-power lines 211 whose orthographic projections overlapping the orthographic projection of the main body 411 on the substrate 100 are arranged in parallel and in equal interval. Exemplarily, the main body 411 has a third symmetry axis in the second direction F2, and in the first-color sub-pixel 010, the at least two sub-power lines 211 whose orthographic projections overlapping the orthographic projection of the main body 411 on the substrate 100 are disposed on two sides of the center of the main body 411 substantially axisymmetrically about the third symmetry axis. Exemplarily, the orthographic projection of the main body 411 on the substrate 100 overlaps the orthographic projections of the two sub-power lines 211 on the substrate 100. Thus, the sub-power lines 211 support the first insulating layer so that the main body 411 is as flat as possible, and the asymmetry of the main body 411 may be reduced. In this way, the asymmetry of light emission in the effective light emitting area may be improved or even eliminated, thereby improving or even eliminating the color cast phenomenon of the display panel.

In some embodiments, in an embodiment of the present disclosure, as shown in FIG. 11, in the third-color sub-pixel 030, an orthographic projection of the main body 413 on the substrate 100 overlaps orthographic projections of at least two sub-power lines 211 on the substrate 100; and the at least two sub-power lines 211 whose orthographic projections overlapping the orthographic projection of the main body 413 on the substrate 100 are arranged in parallel and in equal interval. Further, the main body 413 has a second symmetry axis in the second direction F2; and in the third-color sub-pixel 030, the at least two sub-power lines 211 whose orthographic projections overlapping the orthographic projection of the main body 413 on the substrate 100 are disposed on two sides of the center of the main body 413 substantially axisymmetrically about the second symmetry axis. Exemplarily, the orthographic projection of the main body 413 on the substrate 100 overlaps the orthographic projections of the two sub-power lines 211 on the substrate 100. Thus, the sub-power lines 211 support the first insulating layer so that the main body 413 is as flat as possible, and the asymmetry of the main body 413 may be reduced. In this way, the asymmetry of light emission in the effective light emitting area may be improved or even eliminated, thereby improving or even eliminating the color cast phenomenon of the display panel.

Figure 12:
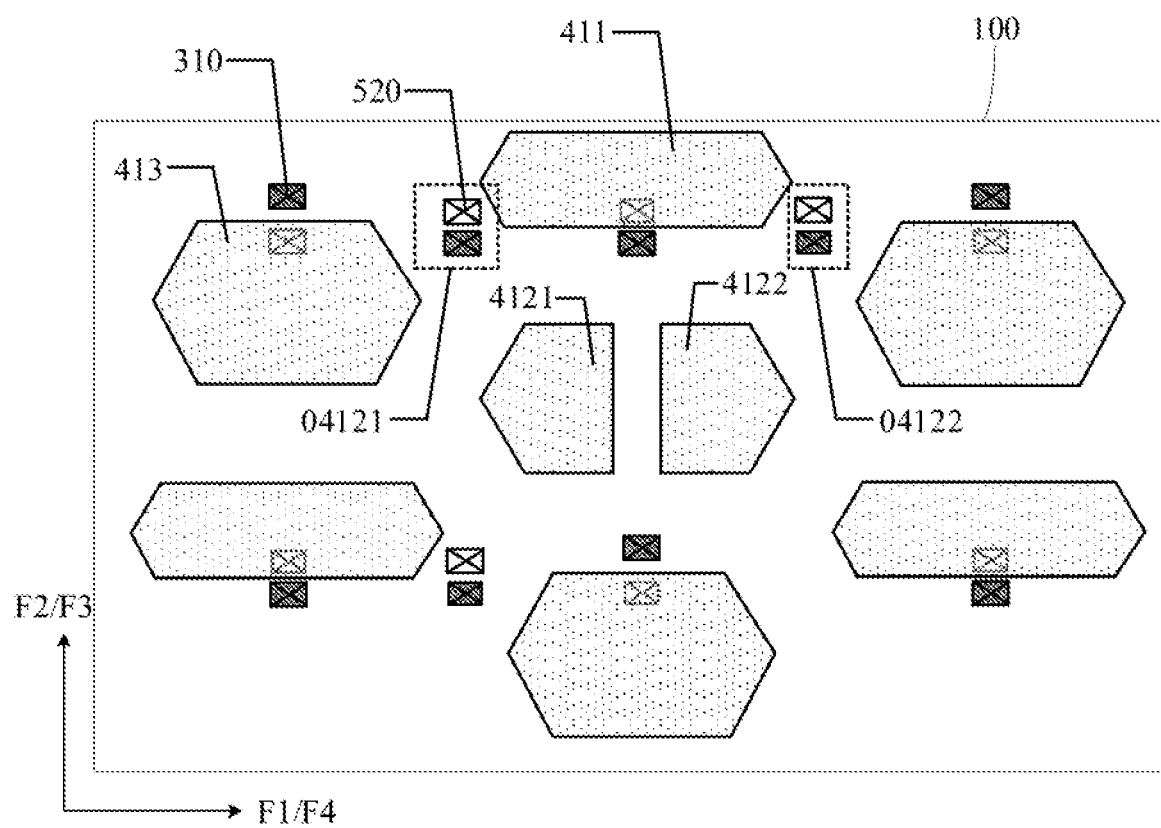
FIG. 12 is a fourth structural diagram of an electroluminescent display panel provided by an embodiment of the present disclosure.

In some embodiments, in an embodiment of the present disclosure, as shown in FIG. 12, in the third-color sub-pixel 030, an orthographic projection of the first via hole 310 on the substrate 100 is substantially away from the orthographic projection of the main body 413 on the substrate 100, and an orthographic projection of the second via hole 520 on the substrate 100 is located within the orthographic projection of the main body 413 on the substrate 100. Exemplarily, the first via hole 310 and the second via hole 520 of the third-color sub-pixel 030 are arranged on the same straight line along the second direction F2. It should be noted that FIG. 12 only illustrates a positional relationship among a main body 410, a first via hole 310 and a second via hole 520 in each color sub-pixel. For the implementation of other layers, reference may be made to other embodiments of the present disclosure, and details are not described herein.

In some embodiments, in an embodiment of the present disclosure, as shown in FIG. 12, in the first-color sub-pixel 010, an orthographic projection of the first via hole 310 on the substrate 100 is substantially away from the orthographic projection of the main body 411 on the substrate 100; and an orthographic projection of the second via hole 520 on the substrate 400 is located within the orthographic projection of the main body 411 on the substrate 100. Exemplarily, the first via hole 310 and the second via hole 520 of the first-color sub-pixel 010 are arranged on the same straight line along the second direction F2.

In some embodiments, in an embodiment of the present disclosure, as shown in FIG. 12, an orthographic projection of the first via hole 310 of the first second-color sub-pixel 021 in the second-color sub-pixel pair 020 on the substrate 100 is substantially close to the orthographic projection of the main body 4121 on the substrate 100, and in the second direction F2, an orthographic projection of the second via hole 520 on the substrate 100 is disposed on a side of the orthographic projection of the first via hole 310 on the substrate 100 away from the orthographic projection of the main body 4121 on the substrate 100. Exemplarily, the first via hole 310 and the second via hole 520 of the first second-color sub-pixel 021 are located in the upper left corner of the main body 4121, that is, the first via hole 310 and the second via hole 520 in a dashed box 04121.

In some embodiments, in an embodiment of the present disclosure, as shown in FIG. 12, an orthographic projection of the first via hole 310 of the second second-color sub-pixel 022 in the second-color sub-pixel pair 020 on the substrate 100 is substantially close to the orthographic projection of the main body 4122 on the substrate 100, and in the second direction F2, an orthographic projection of the second via hole 520 on the substrate 100 is disposed on a side of the orthographic projection of the first via hole 310 on the substrate 100 away from the orthographic projection of the main body 4122 on the substrate 100. Exemplarily, the first via hole 310 and the second via hole 520 of the second second-color sub-pixel 022 are located in the upper right corner of the main body 4122, that is, the first via hole 310 and the second via hole 520 in a dashed box 04122.

In some embodiments, in an embodiment of the present disclosure, as shown in FIGS. 11 and 12, in the same repeating unit 001, the first via hole 310 of the first-color sub-pixel 010, and the first via holes 320 of the two second-color sub-pixels 021, 022 in the second-color sub-pixel pair 020 are arranged on the same straight line along the first direction F1.

In some embodiments, in an embodiment of the present disclosure, as shown in FIGS. 11 and 12, in odd-numbered repeating unit groups, the first via holes 310 of the first-color sub-pixels 010 and the first via holes 310 of the two second-color sub-pixels 021, 022 in the second-color sub-pixel pairs 020, in the same row of repeating units are arranged on the same straight line along the first direction.

In this way, the three first via hole 310 are arranged on the same straight line along the first direction F1, to reduce the design difficulty of the mask used in preparation of the three first via hole 310.

In some embodiments, in an embodiment of the present disclosure, as shown in FIGS. 11 and 12, in the odd-numbered repeating unit groups, the first via holes 310 of the third-color sub-pixels 030 in the same row of repeating units are arranged on the same straight line along the first direction F1.

In some embodiments, in an embodiment of the present disclosure, as shown in FIGS. 11 and 12, in the even-numbered repeating unit groups, the first via holes 310 of the first-color sub-pixels 010 and the first via holes 310 of the two second-color sub-pixels 022 in the second-color sub-pixel pairs 020, in the same row of repeating units are arranged on the same straight line along the first direction. In this way, the three first via hole 310 are arranged on the same straight line along the first direction F1, to reduce the design difficulty of the mask used in preparation of the three first via hole 310.

In some embodiments, in an embodiment of the present disclosure, as shown in FIGS. 11 and 12, in the even-numbered repeating unit groups, the first via holes 310 of the third-color sub-pixels 030 in the same row of repeating units are arranged on the same straight line along the first direction F1.

In some embodiments, in an embodiment of the present disclosure, as shown in FIGS. 11 and 12, for a first-color sub-pixel 010 in a repeating unit group 002, and a third-color sub-pixel 030 that is in an adjacent repeating unit group 002 and nearest to the first-color sub-pixel 010, the first via hole 310 of the first-color sub-pixel 010 and the second via hole 520 of the third-color sub-pixel 030 are arranged on the same straight line along the first direction F1.

It should be noted that FIG. 11 only illustrates implementations of the main bodies and the sub-power lines in the respective color sub-pixels. For implementations of other film layers, reference may be made to the above embodiment, and details are not described herein. FIG. 12 only illustrates implementations of the main bodies, the first via holes, and the second via holes in the respective color sub-pixels. For implementations of other film layers, reference may be made to the above embodiment, and details are not described herein.

Figure 13:
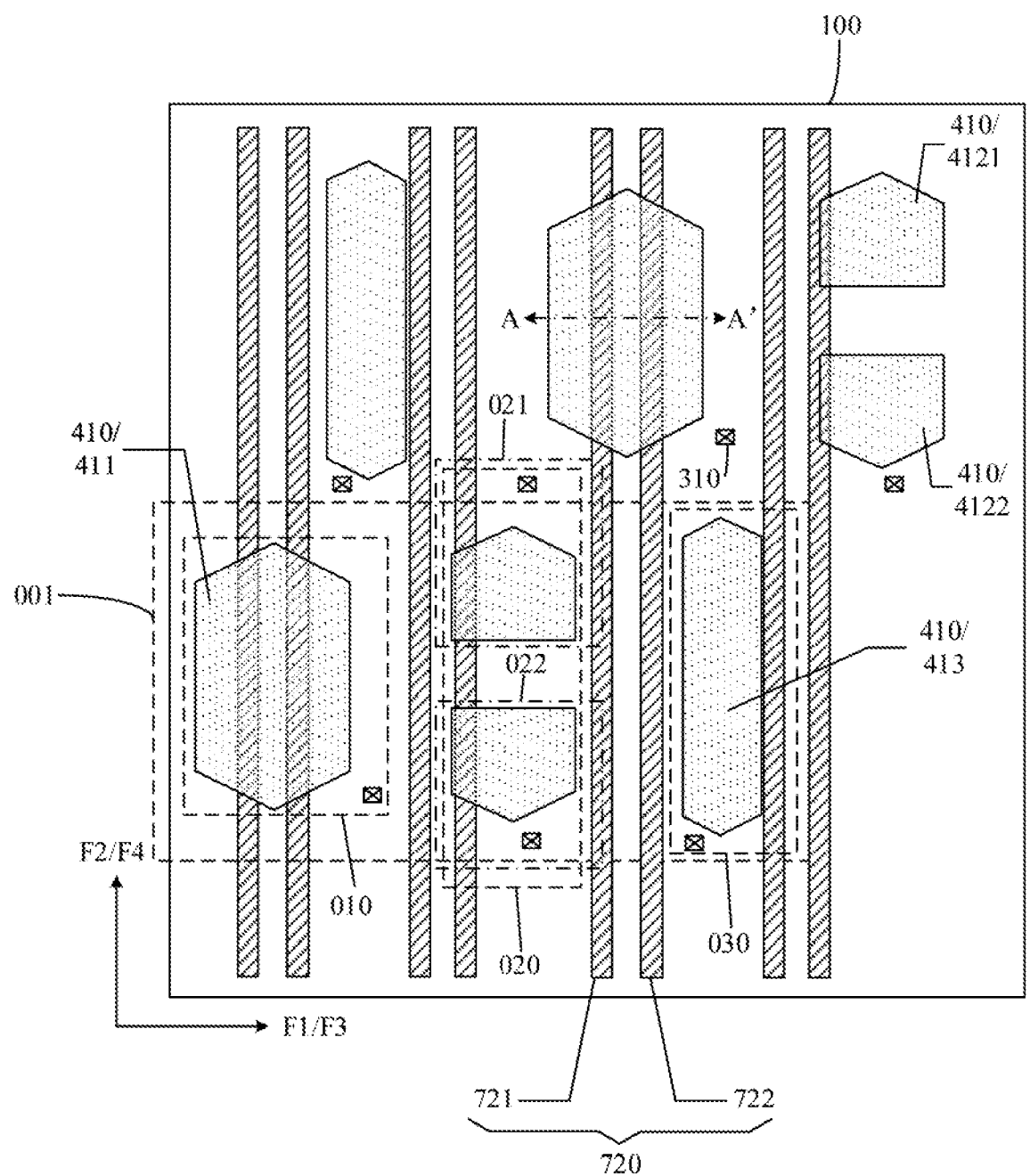
FIG. 13 is a fifth schematic structural diagram of an electroluminescent display panel provided by an embodiment of the present disclosure.

Generally, to reduce the thicknesses of the film layers, the data lines and power lines (VDD lines) are prepared on the driving circuit before the anode is prepared, and thereafter the planarization layer is prepared, and then the anode is prepared. However, due to a large thickness of the signal lines made of the source-drain metal layer, the planarization layer on the signal lines made of the source-drain metal layer cannot completely planarize the signal lines, resulting in unevenness of the anode on the planarization layer and the light emitting layer on the anode, and forming an asymmetric protrusion on the anode and the light emitting layer on the anode, thereby resulting in a color cast phenomenon when viewed from the left and right sides of the normal of the display panel at the same angle with respect to the normal of the display panel. Therefore, an embodiment of the present disclosure further provides some electroluminescent display panels, as shown in FIGS. 13 and 14, which may include a plurality of repeating units 001, each repeating unit 001 including a plurality of sub-pixels, and each sub-pixel may include a first conductive layer 200 disposed on a substrate 100, a first insulating layer 300 above the first conductive layer 200, and an anode 400 on the first insulating layer 300. Furthermore, the first insulating layer 300 includes a first via hole 310, and the anode 400 includes a main body 410 and an auxiliary portion 420 electrically connected to each other. The first via hole 310 exposes a portion of the first conductive layer 200, and the auxiliary portion 420 is electrically connected to the first conductive layer 200 through the first via hole 310. Furthermore, at least one of the plurality of repeating units may include a first-color sub-pixel 010, a second-color sub-pixel, and a third-color sub-pixel 030, wherein the area of the main body 413 of the third-color sub-pixel 030 is larger than the area of the main body of the second-color sub-pixel and the area of the main body 400 of the first-color sub-pixel 010. An overlapping area between the main body 413 of the third-color sub-pixel 030 and the first conductive layer 200 is larger than an overlapping area between the main body of the second-color sub-pixel and the first conductive layer 200, and the overlapping area between the main body 413 of the third-color sub-pixel 030 and the first conductive layer 200 is larger than an overlapping area between the main body 411 of the first-color sub-pixel 010 and the first conductive layer 200. Thus, the first conductive layer 200 may have a hollow pattern, and a portion of the hollow pattern whose orthographic projection overlapping the orthographic projection of the main body 410 on the substrate 100 is configured such that at least a central area AA of the main body 410 is substantially flat. It should be noted that FIG. 13 only shows the main bodies of the respective sub-pixels, and for implementations of the auxiliary portions, reference may be made to the above embodiment, and the above description is only based on the third-color sub-pixel as an example, and the configuration in other sub-pixels may be deduced by analogy, which will not be repeated herein.

In the electroluminescent display panel provided by the embodiment of the present disclosure, the first conductive layer whose orthographic projection overlapping the orthographic projection of the main body on the substrate is substantially symmetric about at least one symmetry axis. Thus, the main body may have a symmetric protrusion, so that areas on two sides of the symmetry axis of the main body are symmetrically arranged, thereby reducing the asymmetry of the main body. In this way, the asymmetry of light emission in the effective light emitting area may be improved or even eliminated, thereby improving or even eliminating the color cast phenomenon of the display panel.

Figure 14A:
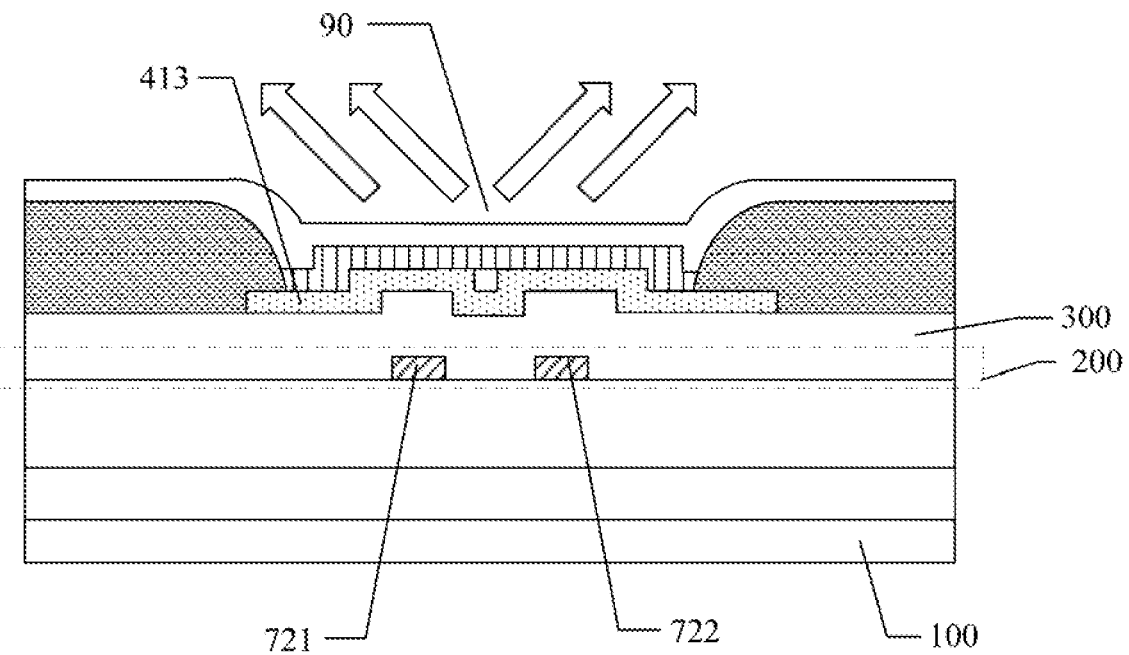
FIG. 14a is a schematic structural diagram of a sectional view of the electroluminescent display panel taken along the line AA' as indicated in FIG. 13.
Figure 14B:
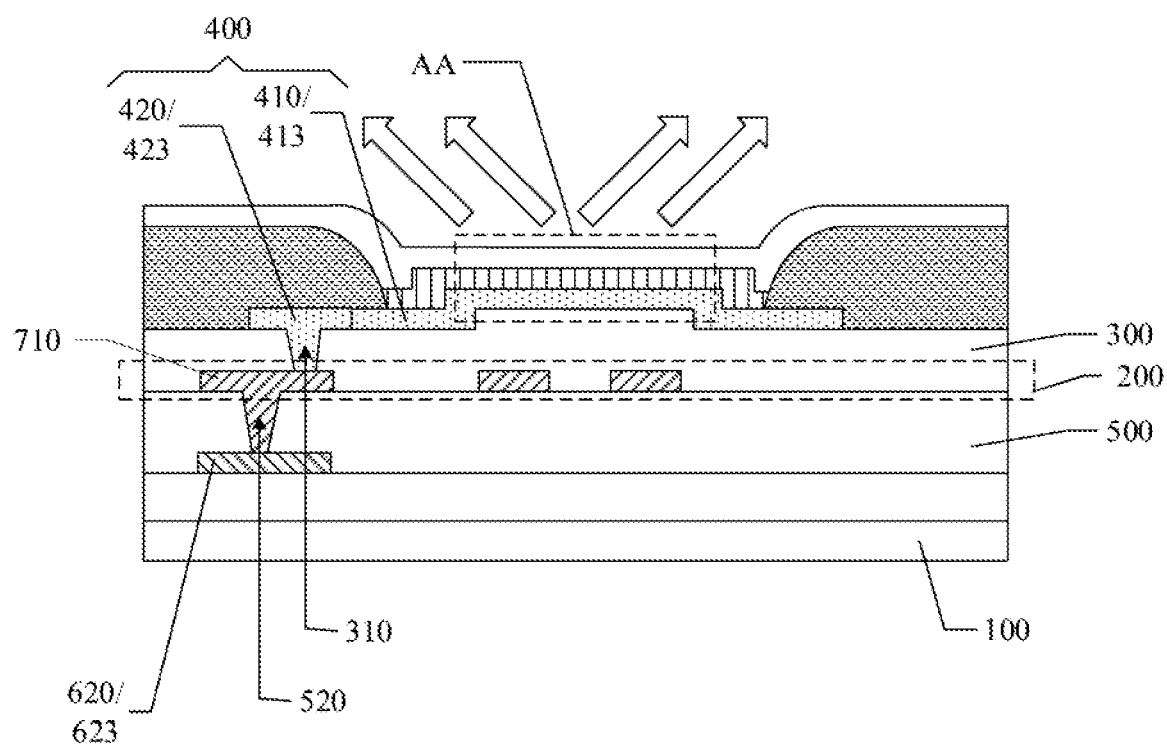
FIG. 14b is a schematic structural diagram of a sectional view of a third-color sub-pixel in the electroluminescent display panel shown in FIG. 13.

In some embodiments, in an embodiment of the present disclosure, as shown in FIGS. 13 to 14b, the first conductive layer 200 includes a first bridging line, a first connection line 710, and a plurality of signal line groups 720 arranged at intervals in the first direction, wherein in each sub-pixel, the auxiliary portion 420 is electrically connected to the first connection line 710 through the first via hole 310; each signal line group 720 includes at least two different signal lines 721, 722, and the signal lines 721, 722 extend along the second direction F2; and the first direction F1 is different from the second direction F2. Furthermore, in at least one sub-pixel, the orthographic projection of the main body on the substrate overlaps an orthographic projection of at least one signal line group 720 on the substrate; and center lines in the second direction of the signal lines in the signal line group whose orthographic projection overlapping the orthographic projection of the main body on the substrate are substantially axisymmetric about a symmetry axis of the main body along the second direction.

Exemplarily, the first connection line may be electrically connected with a drain of a transistor in the driving circuit to achieve signal transmission. Exemplarily, the first bridging line is configured to electrically connect at least two electrodes of a source, a drain, and a gate of some transistors in the driving circuit to achieve signal transmission. It should be noted that FIG. 13 only illustrates implementations of the main bodies and the signal line groups in the respective color sub-pixels. For implementations of other film layers, reference may be made to the above embodiment, and details are not described herein.

Exemplarily, each signal line group 720 may include two signal lines 721, 722. For example, the signal line group 720 may include a data line 721 configured to transmit a data signal and a power line 722 configured to transmit a driving voltage. Of course, embodiments of the present disclosure include but are not limited this. The number of signal lines that the above-mentioned signal line group may include may also be other numbers.

Generally in the display field, one pixel usually includes a plurality of sub-pixels, each of which may display a single color (such as red, green or blue) respectively, and proportions of the sub-pixels of different colors are controlled to display different colors, so the above-mentioned sub-pixels may be single-color sub-pixels. In some embodiments, in an embodiment of the present disclosure, as shown in FIG. 13, each of the plurality of repeating units 001 may include one first-color sub-pixel 010, one second-color sub-pixel pair 020 and one third-color sub-pixel 030 arranged in a third direction F3. The second-color sub-pixel pair 020 may include two second-color sub-pixels 021, 022 arranged in a fourth direction F4. The first-color sub-pixel 010 is configured to emit light of a first color, the second-color sub-pixels 021, 022 are configured to emit light of a second color, and the third-color sub-pixel is configured to emit light of a third color. In some examples, the first color, the second color and the third color may be selected from red, green and blue. For example, the first-color is blue, the second-color is green, and the third-color is red; or the first-color is red, the second-color is green, and the third-color is blue. Therefore, the repeating unit 001 has an arrangement structure of red, green and blue sub-pixels. Of course, embodiments of the present disclosure include but are not limited this. The above-mentioned first color, second color and third color may also be other colors.

In some embodiments, in an embodiment of the present disclosure, as shown in FIG. 13, the third direction F3 is same as the first direction F1, and the fourth direction F4 is same as the second direction F2; the size of the main body 413 of the third-color sub-pixel 030 in the second direction F2 is larger than the size of the main body 413 of the third-color sub-pixel 030 in the first direction F1; and the size of the main body 411 of the first-color sub-pixel 010 in the second direction F2 is larger than the size of the main body 411 of the first-color sub-pixel 010 in the first direction F1. Exemplarily, the size of the main body 411 of the first-color sub-pixel 010 in the first direction F1 is larger than the size of the main body 413 of the third-color sub-pixel 030 in the first direction F1. The size of the main body 411 of the first-color sub-pixel 010 in the second direction F2 is smaller than the size of the main body 413 of the third-color sub-pixel 030 in the second direction F2. Furthermore, for example, the first-color may be blue, the second-color may be green, and the third-color may be red.

Generally, each main body is configured to have a regular shape. Exemplarily, the main body 411 in the first-color sub-pixel 010 has a third symmetry axis in the second direction F2, and the main body 411 may be axisymmetric about the third symmetry axis. For example, the shape of the main body 411 in the first-color sub-pixel 010 is substantially a hexagon or ellipse, wherein a long symmetry axis of the hexagon or a long axis of the ellipse is substantially parallel to the second direction F2; and the long symmetry axis of the hexagon or the long axis of the ellipse may be used as the third symmetry axis of the main body 411.

Exemplarily, the main body 4121 of the second-color sub-pixel 021 and the main body 4122 of the second-color sub-pixel 022 in the same second-color sub-pixel pair 022 are substantially axisymmetric about a fourth symmetry axis in the second direction F2. That is, the main body 4121 and the main body 4122 in the same second-color sub-pixel pair 022 are axisymmetric about the fourth symmetry axis. The shape of the main body 4121, 4122 in the second-color sub-pixel 021, 022 is substantially a pentagon, and the symmetry axis of the pentagon is substantially parallel to the second direction F2.

Exemplarily, the main body 413 of the third-color sub-pixel 030 has a second symmetry axis in the second direction F2, and the main body 413 may be axisymmetric about the second symmetry axis. For example, the shape of the main body 413 in the third-color sub-pixel 030 is substantially a hexagon or ellipse, wherein a long symmetry axis of the hexagon or a long axis of the ellipse is substantially parallel to the second direction F2; and the long symmetry axis of the hexagon or the long axis of the ellipse may be used as the second symmetry axis of the main body 413.

In some embodiments, in an embodiment of the present disclosure, as shown in FIGS. 13 and 14a, in the first-color sub-pixel 010, the orthographic projection of the main body 411 on the substrate 100 overlaps an orthographic projection of at least one signal line group 720 on the substrate 100. Furthermore, in the first-color sub-pixel 010, center lines in the second direction F2 of the signal lines in the signal line group 200 overlapping the orthographic projection of the main body 411 on the substrate 100 are substantially axisymmetric about the third symmetry axis. Exemplarily, the orthographic projection of the main body 411 on the substrate 100 overlaps the orthographic projection of one signal line group 720 on the substrate 100. Furthermore, in the first-color sub-pixel 010, the signal lines 721 and 722 in the signal line group 200 overlapping the orthographic projection of the main body 411 on the substrate 100 are substantially axisymmetric about the first symmetry axis. Thus, the main body 411 may have two symmetric protrusions, so that areas on two sides of the first symmetry axis of the main body 411 are symmetrically arranged, thereby reducing the asymmetry of the main body 411. In this way, the asymmetry of light emission in the effective light emitting area 90 may be improved or even eliminated, thereby improving or even eliminating the color cast phenomenon of the display panel.

To achieve a better effect of overlapping the main body 411 and the signal line group, in some embodiments, in an embodiment of the present disclosure, as shown in FIG. 13, the distance between the data line and the power line in one signal line group may be smaller than the distance between two adjacent signal line groups. Of course, the distance between the data line and the power line in one signal line group and the distance between two adjacent signal line groups may be designed and determined according to the actual application environment, which is not limited herein.

In some embodiments, in an embodiment of the present disclosure, as shown in FIG. 13, in the third-color sub-pixel 030, an overlapping area between the orthographic projection of the main body 413 on the substrate 100 and the orthographic projection of the nearest signal line group 200 on the substrate 100 is smaller than 10% of the area of the main body 413. Exemplarily, the overlapping area between the orthographic projection of the main body 413 on the substrate 100 and the orthographic projection of the nearest signal line group 200 on the substrate 100 is smaller than one of 8%, 5% and 2% of the area of the main body 413.

In some embodiments, in an embodiment of the present disclosure, as shown in FIG. 13, in the third-color sub-pixel 030, the orthographic projection of the main body 413 on the substrate 100 does not overlap the orthographic projection of the signal line group 200 on the substrate 100. In this way, the signal lines 721 and 722 are not provided under the main body 413, so that the main body 413 is as flat as possible. In this way, the asymmetry of light emission in the effective light emitting area may be improved or even eliminated, thereby improving or even eliminating the color cast phenomenon of the display panel.

Generally, the insulating layer is provided with via holes, and to avoid the influence of the via holes on the main body, in some embodiments, in an embodiment of the present disclosure, as shown in FIGS. 13 and 14b, in the same sub-pixel, the orthographic projection of the main body 410 on the substrate 100 does not overlap an orthographic projection of the first via hole 310 on the substrate 100. Exemplarily, the orthographic projection of the main body 411 in the first-color sub-pixel 010 on the substrate 100 does not overlap the orthographic projection of the first via hole 310 on the substrate 100. The orthographic projection of the main body 4121, 4122 of the second-color sub-pixel 021, 022 on the substrate 100 does not overlap the orthographic projection of the first via hole 310 on the substrate 100. The orthographic projection of the main body 413 in the third-color sub-pixel 030 on the substrate 100 does not overlap the orthographic projection of the first via hole 310 on the substrate 100.

In some embodiments, in an embodiment of the present disclosure, as shown in FIG. 13, for one repeating unit group, the first via holes 310 of the third-color sub-pixels 030 and the first via holes 310 of the second second-color sub-pixels 022 in the second-color sub-pixel pairs 020, in the repeating unit group, and the first via holes 310 of the first second-color sub-pixels 021 in the second-color sub-pixel pairs 020 adjacent to the repeating unit group are arranged on the same straight line along the first direction F1. Exemplarily, the first via hole 310 of the third-color sub-pixel 030, and the first via hole 310 of the second second-color sub-pixel 022, in the first row of the repeating unit group 002, and the first via hole 310 of the first second-color sub-pixel 021 in the second row of the repeating unit group 002, the three first via holes 310 are arranged on the same straight line along the first direction F1 to reduce the design difficulty of a mask used in preparation of the three first via holes 310.

Figure 15:
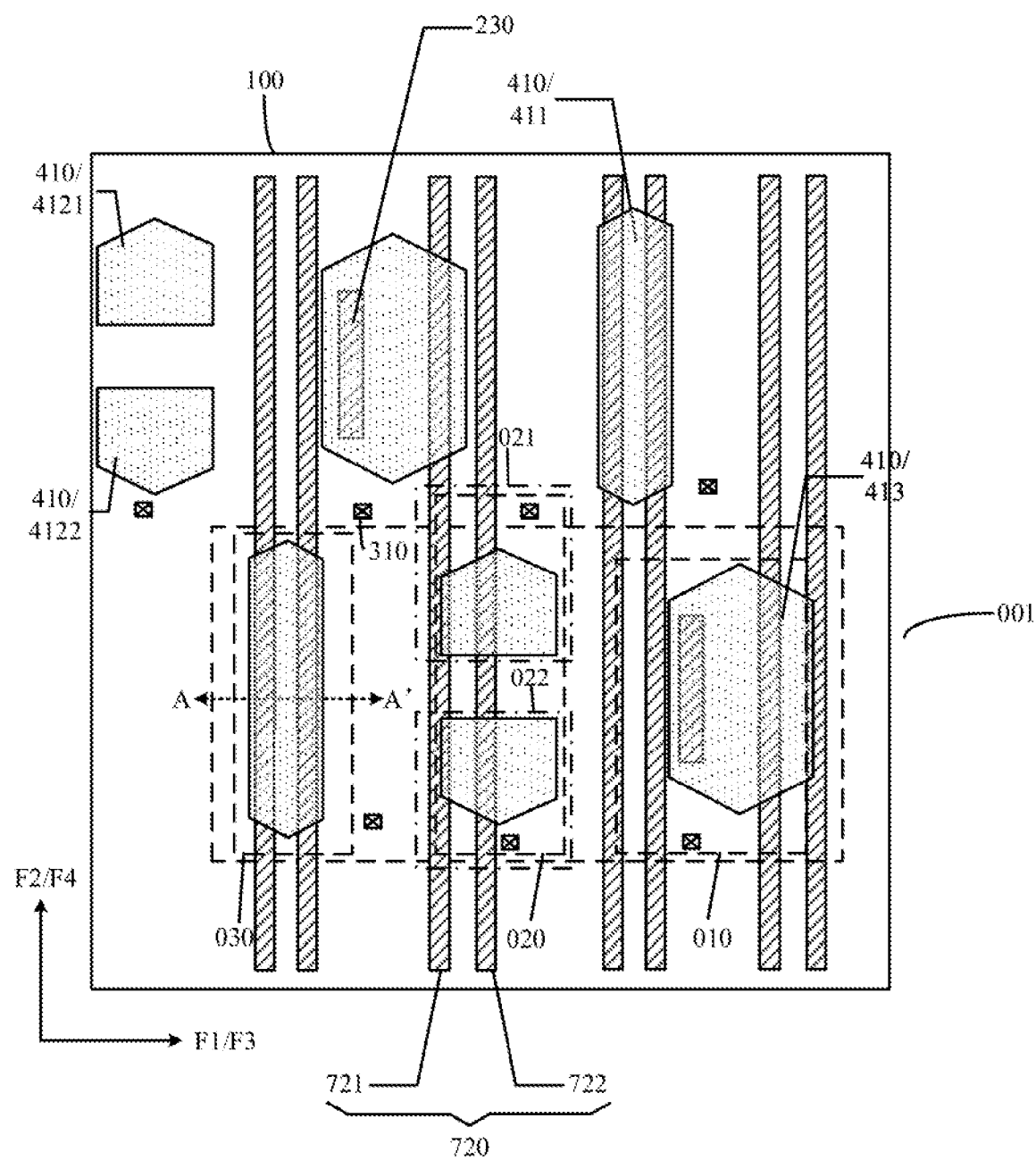
FIG. 15 is a sixth structural diagram of an electroluminescent display panel provided by an embodiment of the present disclosure.

An embodiment of the present disclosure further provides schematic structural diagrams of some electroluminescent display panels, as shown in FIG. 15, with modifications to the above implementation. Only differences between this embodiment and the above embodiment are described below, while similarities are not repeated herein.

In some embodiments, in an embodiment of the present disclosure, as shown in FIG. 15, the first conductive layer 200 includes a first bridging line 230, a first connection line 710 and a plurality of signal line groups 720 arranged at intervals in the first direction, wherein in each sub-pixel, the auxiliary portion 420 is electrically connected to the first connection line 710 through the first via hole 310; each signal line group 720 includes at least two signal lines 721, 722, and the signal lines 721, 722 extend along the second direction F2; and the first direction F1 is different from the second direction F2. Exemplarily, the first connection line may be electrically connected with a drain of a transistor in the driving circuit to achieve signal transmission. Exemplarily, the first bridging line 230 is configured to electrically connect at least two electrodes of a source, a drain, and a gate of some transistors in the driving circuit to achieve signal transmission. It should be noted that FIG. 15 only illustrates implementations of the main bodies, the signal line groups and the first bridging lines 230 in the respective color sub-pixels. For implementations of other film layers, reference may be made to the above embodiment, and details are not described herein.

In some embodiments, in an embodiment of the present disclosure, as shown in FIG. 15, the size of the main body 413 of the third-color sub-pixel 030 in the first direction F1 is larger than the size of the main body 413 of the first-color sub-pixel 010 in the first direction F1. The size of the main body 413 of the third-color sub-pixel 030 in the second direction F2 is smaller than the size of the main body 413 of the first-color sub-pixel 010 in the second direction F2. Furthermore, exemplarily, the first-color may be red, the second-color may be green, and the third-color may be blue.

Figure 16:
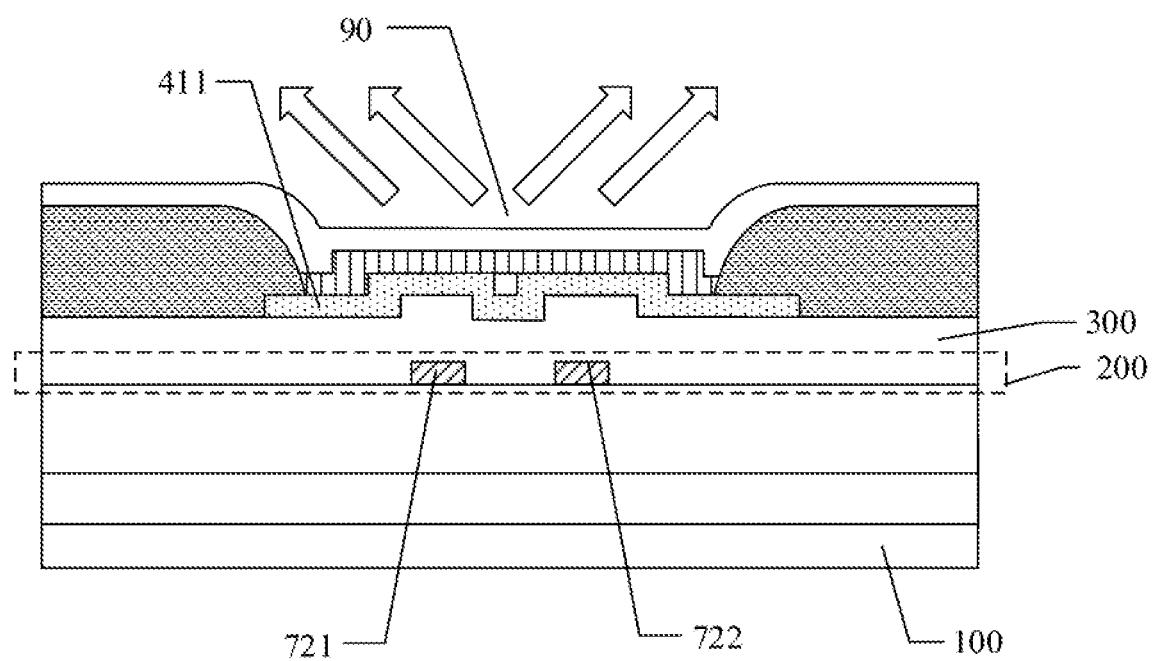
FIG. 16 is a schematic structural diagram of a sectional view of a first-color sub-pixel in the electroluminescent display panel shown in FIG. 15.

In some embodiments, in an embodiment of the present disclosure, as shown in FIGS. 15 and 16, in the first-color sub-pixel 010, the orthographic projection of the main body 411 on the substrate 100 overlaps an orthographic projection of at least one signal line group 720 on the substrate; and in the first-color sub-pixel 010, center lines in the second direction F2 of the signal lines in the signal line group 200 overlapping the orthographic projection of the main body 411 on the substrate 100 are substantially axisymmetric about a third symmetry axis of the main body 411 along the second direction F2. Exemplarily, the orthographic projection of the main body 411 on the substrate 100 overlaps the orthographic projection of one signal line group 720 on the substrate, and the signal lines 721 and 722 overlapping the orthographic projection of the main body 411 on the substrate 100 are substantially axisymmetric about the third symmetry axis. Thus, the main body 411 may have two symmetric protrusions, so that areas on two sides of the third symmetry axis of the main body 411 are symmetrically arranged, thereby reducing the asymmetry of the main body 411. In this way, the asymmetry of light emission in the effective light emitting area 90 may be improved or even eliminated, thereby improving or even eliminating the color cast phenomenon of the display panel.

In some embodiments, in an embodiment of the present disclosure, as shown in FIGS. 15 and 16, in the third-color sub-pixel 030, the orthographic projection of the main body 413 on the substrate 100 overlaps an orthographic projection of at least one signal line group 720 on the substrate 100 and an orthographic projection of at least one first bridging line 230 on the substrate 100. Furthermore, in the third-color sub-pixel 030, a center line in the second direction F2 of the signal lines in the signal line group 200 overlapping the orthographic projection of the main body 413 on the substrate 100, and a center line in the second direction F2 of the first bridging line 230 are substantially axisymmetric about a second symmetry axis of the main body 413 along the second direction F2. Thus, the effective light emitting area 90 of the main body 413 may also have two symmetric protrusions, so that areas on two sides of the second symmetry axis of the main body 413 are symmetrically arranged, thereby reducing the asymmetry of the main body 413. In this way, the asymmetry of light emission in the effective light emitting area 90 may be improved or even eliminated, thereby improving or even eliminating the color cast phenomenon of the display panel.

Figure 17:
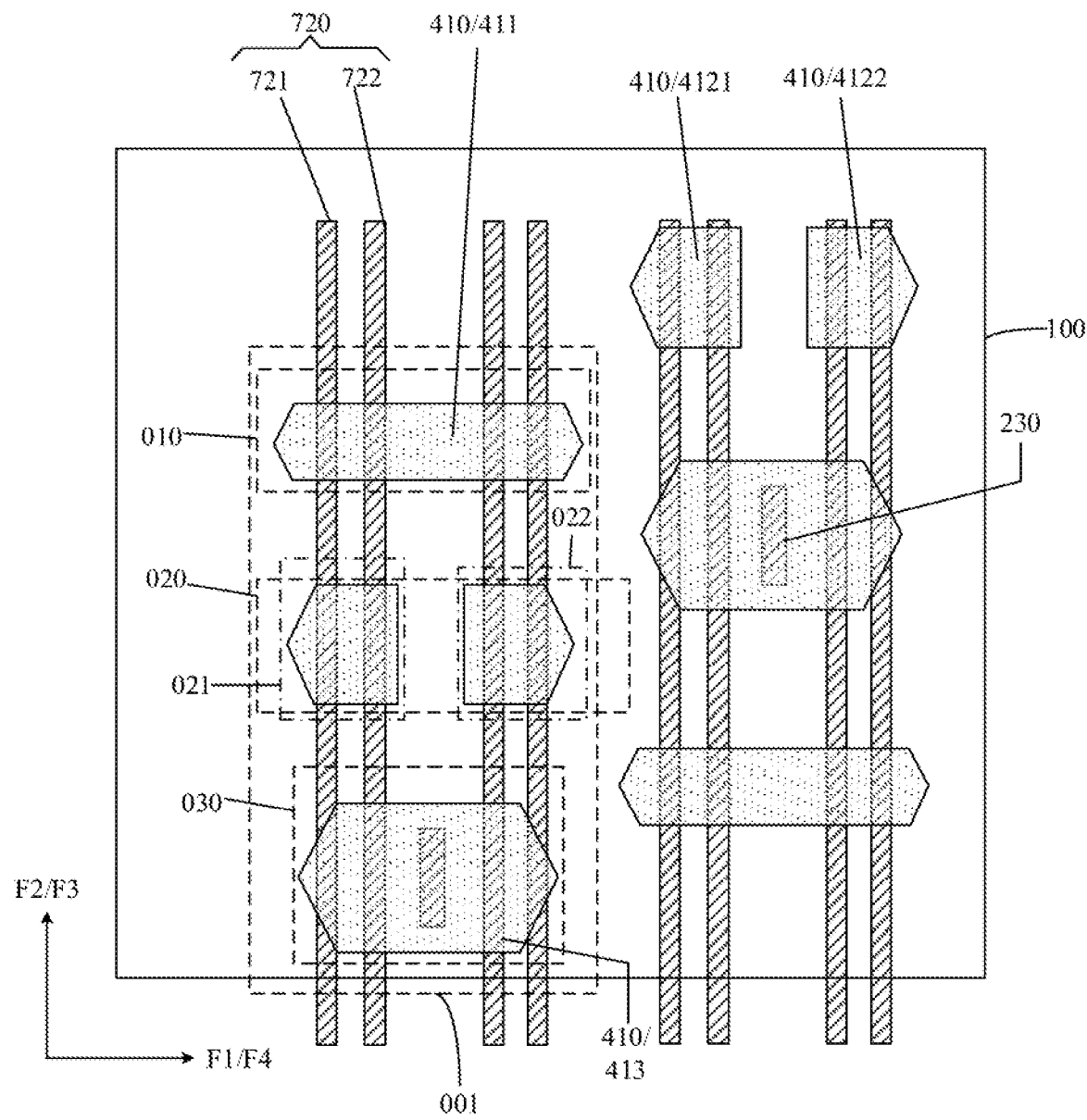
FIG. 17 is a seventh structural diagram of an electroluminescent display panel provided by an embodiment of the present disclosure.

An embodiment of the present disclosure further provides schematic structural diagrams of some electroluminescent display panels, as shown in FIG. 17, with modifications to the above implementation. Only differences between this embodiment and the above embodiment are described below, while similarities are not repeated herein.

In some embodiments, in an embodiment of the present disclosure, as shown in FIG. 17, the third direction F3 may be same as the second direction F2, and the fourth direction F4 may be same as the first direction F1; the size of the main body 413 of the third-color sub-pixel 030 in the first direction F1 is larger than the size of the main body 413 of the third-color sub-pixel 030 in the second direction F2, and the size of the main body 411 of the first-color sub-pixel 010 in the first direction F1 is larger than the size of the main body 411 of the first-color sub-pixel 010 in the second direction F2. Exemplarily, the size of the main body 411 of the first-color sub-pixel 010 in the second direction F2 is smaller than the size of the main body 413 of the third-color sub-pixel 030 in the second direction F2. The size of the main body 411 of the first-color sub-pixel 010 in the first direction F1 is larger than the size of the main body 413 of the third-color sub-pixel 030 in the first direction F1. Furthermore, exemplarily, the first-color may be red, the second-color may be green, and the third-color may be blue. Alternatively, the size of the main body 411 of the first-color sub-pixel 010 in the second direction F2 may also be larger than the size of the main body 413 of the third-color sub-pixel 030 in the second direction F2. The size of the main body 411 of the first-color sub-pixel 010 in the first direction F1 may also be smaller than the size of the main body 413 of the third-color sub-pixel 030 in the first direction F1. Furthermore, for example, the first-color may be blue, the second-color may be green, and the third-color may be red.

In some embodiments, in an embodiment of the present disclosure, as shown in FIG. 17, in the first-color sub-pixel 010, the orthographic projection of the main body 411 on the substrate 100 overlaps orthographic projections of two adjacent signal line groups 720 on the substrate 100; and in the first-color sub-pixel 010, the positions of the two signal line groups 720 overlapping the orthographic projection of the main body 411 on the substrate 100 are substantially axisymmetric about a third symmetry axis of the main body 411 along the second direction F2. Thus, the main body 411 may have two symmetric protrusions substantially axisymmetric about the third symmetry axis, so that areas on two sides of the third symmetry axis of the main body 411 are symmetrically arranged, thereby reducing the asymmetry of the main body 411. In this way, the asymmetry of light emission in the effective light emitting area 90 may be improved or even eliminated, thereby improving or even eliminating the color cast phenomenon of the display panel.

In some embodiments, in an embodiment of the present disclosure, as shown in FIG. 17, in the third-color sub-pixel 030, the orthographic projection of the main body 413 on the substrate 100 overlaps orthographic projections of two adjacent signal line groups 720 on the substrate 100; and in the third-color sub-pixel 030, the positions of the two signal line groups 720 overlapping the orthographic projection of the main body 413 on the substrate 100 are substantially axisymmetric about a second symmetry axis of the main body 413 along the second direction F2. Thus, the main body 413 may have two protrusions substantially symmetric about the second symmetry axis, so that the areas on two sides of the second symmetry axis of the main body 413 are symmetrically arranged, and the main body 413 is supported so that the main body 413 is as flat as possible. Thus, the asymmetry of the main body 413 may be reduced. In this way, the asymmetry of light emission in the effective light emitting area 90 may be improved or even eliminated, thereby improving or even eliminating the color cast phenomenon of the display panel.

In some embodiments, in an embodiment of the present disclosure, as shown in FIG. 17, in the third-color sub-pixel 030, the orthographic projection of the main body 413 on the substrate 100 covers an orthographic projection of one first bridging line 230 on the substrate 100; and the first bridging line 230 overlapping the orthographic projection of the main body 413 on the substrate 100 is substantially axisymmetric about the second symmetry axis of the main body 413 along the second direction F2. Thus, the main body 413 may be supported by the first bridging line 230 and the signal line groups 720, so that the main body 413 is as flat as possible, and the asymmetry of light emission in the effective light emitting area 90 may be improved or even eliminated, thereby improving or even eliminating the color cast phenomenon of the display panel.

In some embodiments, in an embodiment of the present disclosure, as shown in FIG. 17, in the second-color sub-pixel 021, the orthographic projection of the main body 4121 on the substrate 100 overlaps an orthographic projection of one signal line group 720 on the substrate 100. In the second-color sub-pixel 022, the orthographic projection of the main body 4122 on the substrate 100 overlaps an orthographic projection of one signal line group 720 on the substrate 100. Furthermore, the two signal line groups 720 overlapping the two second-color sub-pixels 021, 022 of the same second-color sub-pixel pair 020 are adjacent. That is, the signal line group 720 overlapping the orthographic projection of the main body 4121 on the substrate 100 is adjacent to the signal line group 720 overlapping the orthographic projection of the main body 4122 on the substrate 100.

Exemplarily, in some embodiments, in an embodiment of the present disclosure, as shown in FIG. 17, the second-color sub-pixel pair 022 has a fourth symmetry axis in the second direction F2. That is, the main body 4121 and the main body 4122 in the same second-color sub-pixel pair 022 are substantially axisymmetric about the fourth symmetry axis. Furthermore, the two signal line groups 720 whose orthographic projections overlap the two second-color sub-pixels 021, 022 of the second-color sub-pixel pair 020 are substantially axisymmetric about the fourth symmetry axis. That is, in the same second-color sub-pixel pair 022, the signal line group 720 whose orthographic projection overlaps the main body 4121 and the signal line group 720 whose orthographic projection overlaps the main body 4122 are substantially axisymmetric about the fourth symmetry axis.

Figure 18:
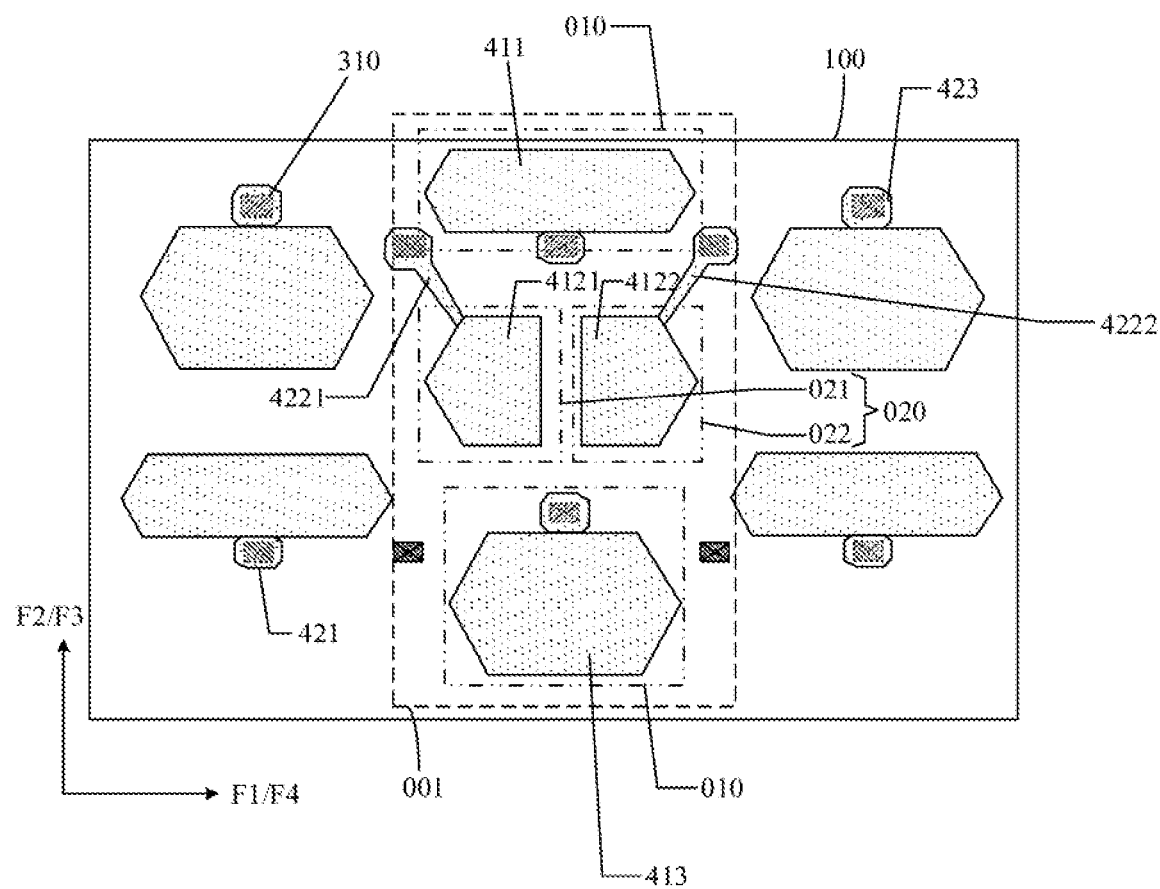
FIG. 18 is an eighth schematic structural diagram of an electroluminescent display panel provided by an embodiment of the present disclosure.

Exemplarily, in some embodiments, in an embodiment of the present disclosure, as shown in FIGS. 17 and 18, for one repeating unit group, the first via hole 310 of the first-color sub-pixel 010, and the first via hole 310 of the first second-color sub-pixel 021 and the first via hole 310 of the second second-color sub-pixel 020 in the second-color sub-pixel pair 020, of one repeating unit in the repeating unit group, and the first via hole 310 of the third-color sub-pixel 030 adjacent to the repeating unit are arranged on the same straight line along the first direction F1. By arranging the four first via holes 310 on the same straight line along the first direction F1, the design difficulty of a mask used in preparation of the four first via holes 310 is reduced.

In some embodiments, in an embodiment of the present disclosure, as shown in FIGS. 17 and 18, in the odd-numbered repeating unit groups, the first via holes 310 of the first-color sub-pixels 010, and the first via holes 310 of the first second-color sub-pixels 021 and the first via holes 310 of the second second-color sub-pixels 022 in the second-color sub-pixel pairs 020, in the same row of repeating units 001 are arranged on the same straight line along the first direction F1. In this way, the design difficulty of a mask used in preparation of the three first via holes 310 in the display panel may also be reduced.

In some embodiments, in an embodiment of the present disclosure, as shown in FIGS. 17 and 18, in the odd-numbered repeating unit groups, the first via holes 310 of the third-color sub-pixels 030 in the same row of repeating units 001 are arranged on the same straight line along the first direction F1. In this way, the design difficulty of a mask used in preparation of the three first via holes 310 in the display panel may also be reduced.

In some embodiments, in an embodiment of the present disclosure, as shown in FIGS. 17 and 18, in even-numbered repeating unit groups, the first via holes 310 of the first-color sub-pixels 010, and the first via holes 310 of the first second-color sub-pixels 021 and the first via holes 310 of the second second-color sub-pixels 022 in the second-color sub-pixel pairs 020, in the same row of repeating units 001 are arranged on the same straight line along the first direction F1. In this way, the design difficulty of a mask used in preparation of the three first via holes 310 in the display panel may also be reduced.

In some embodiments, in an embodiment of the present disclosure, as shown in FIGS. 17 and 18, in the even-numbered repeating unit group, the first via holes 310 of the third-color sub-pixels 030 in the same row of repeating units 001 are arranged on the same straight line along the first The direction F1. In this way, the design difficulty of a mask used in preparation of the three first via holes 310 in the display panel may also be reduced.

It should be noted that FIG. 17 only illustrates implementations of the signal line groups and the main bodies of the respective sub-pixels. For implementations of other film layers, reference may be made to the above embodiment, and details are not described herein. FIG. 18 only illustrates implementations of the main bodies, the auxiliary portions and the first via holes 310 in the respective sub-pixels. For implementations of other film layers, reference may be made to the above embodiment, and details are not described herein.

Based on the same inventive concept, an embodiment of the present disclosure further provides a display device, including the above-mentioned electroluminescent display panel provided by an embodiment of the present disclosure. The display device may be a mobile phone, a tablet computer, a television, a display, a notebook computer, a digital photo frame, a navigator, or any other product or component with a display function. Other indispensable components of the display device are present as understood by those skilled in the art, and are not described herein, nor should they be construed as limiting the present disclosure. For the implementation of the display device, reference may be made to the embodiment of the above-mentioned electroluminescent display panel, repeated description is omitted herein.

The electroluminescent display panel and the display device provided by embodiments of the present disclosure can eliminate the asymmetry of light emission, thereby improving or even eliminating the color cast phenomenon of the display panel.

Apparently, those skilled in the art can make changes and modifications to the embodiments of the present disclosure without departing from the spirit and scope of the present disclosure. Thus, the present disclosure is also intended to encompass these changes and modifications if such changes and modifications of the present disclosure are within the scope of the claims of the present disclosure and equivalents thereof

The invention claimed is:

1. An electroluminescent display panel, comprising:
a plurality of repeating units each comprising a plurality of sub-pixels, wherein:
   each of the plurality of sub-pixels comprises:
      a first conductive layer disposed on a substrate;
      a first insulating layer disposed on the first conductive layer and comprising a first via hole, wherein the first via hole exposes a portion of the first conductive layer; and
      an anode disposed on the first insulating layer and comprising a main body and an auxiliary portion electrically connected to each other, wherein the auxiliary portion is electrically connected to the first conductive layer through the first via hole; and
   at least one of the plurality of repeating units comprises a first-color sub-pixel, a second-color sub-pixel, and a third-color sub-pixel, wherein:
      an area of a main body of the third-color sub-pixel is larger than an area of a main body of the second-color sub-pixel and an area of a main body of the first-color sub-pixel; and
      an overlapping area between the main body of the third-color sub-pixel and the first conductive layer is larger than an overlapping area between the main body of the second-color sub-pixel and the first conductive layer, and the overlapping area between the main body of the third-color sub-pixel and the first conductive layer is larger than an overlapping area between the main body of the first-color sub-pixel and the first conductive layer,
   wherein: of the plurality of repeating units comprises one first-color sub-pixel, one second-color sub-pixel pair and one third-color sub-pixel arranged in a third direction, wherein the second-color sub-pixel pair comprises two second-color sub-pixels arranged in a fourth direction; and
   the plurality of repeating units are arranged in the third direction to form repeating unit groups, wherein the repeating unit groups are arranged in the fourth direction, and repeating units in every two adjacent repeating unit groups are arranged in a staggered manner.

2. The electroluminescent display panel according to claim 1, wherein the overlapping area between the main body of the third-color sub-pixel and the first conductive layer is larger than a sum of the overlapping area between the main body of the second-color sub-pixel and the first conductive layer and the overlapping area between the main body of the first-color sub-pixel and the first conductive layer.

3. The electroluminescent display panel according to claim 1, wherein: a main body of at least one of the sub-pixels has at least one symmetry axis, and an orthographic projection of the main body on the substrate overlaps an orthographic projection of the first conductive layer on the substrate; and an area ratio of the first conductive layer with the orthographic projection overlapping the orthographic projection of the main body of the at least one sub-pixel on the substrate, on two sides of the at least one symmetry axis is within a range of 1±0.1.

4. The electroluminescent display panel according to claim 3, wherein the first conductive layer comprises a first power line and a first connection line spaced apart from each other, and wherein in each of the plurality of sub-pixels, the auxiliary portion is electrically connected to the first connection line through the first via hole.

5. The electroluminescent display panel according to claim 4, wherein the electroluminescent display panel further comprises:
  a second insulating layer between the first conductive layer and the substrate; and
  a second conductive layer between the second insulating layer and the substrate,
  wherein:
  the second conductive layer comprises a second power line and a second connection line spaced apart from each other;
  the second insulating layer has a second via hole exposing the second connection line, and a third via hole exposing a portion of the second power line;
  the first power line is electrically connected with the second power line through the third via hole; and
  the first connection line is electrically connected with the second connection line through the second via hole.

6. The electroluminescent display panel according to claim 5, wherein the first power line comprises:
  a plurality of sub-power lines arranged in a first direction and extending in a second direction; and
  conduction lines electrically connecting the sub-power lines, and
  wherein the first direction is different from the second direction.

7. The electroluminescent display panel according to claim 6, wherein:
  in the third-color sub-pixel, the sub-power line with the orthographic projection overlapping the orthographic projection of the main body on the substrate is substantially axisymmetric about a first symmetry axis, and the sub-power line with the orthographic projection overlapping the orthographic projection of the main body on the substrate covers the center of the main body; and
  in the third-color sub-pixel, the main body has a second symmetry axis in the second direction, and the at least two first conduction lines with the orthographic projections overlapping the orthographic projection of the main body on the substrate are substantially axisymmetric about the second symmetry axis.

8. The electroluminescent display panel according to claim 6, wherein in the third-color sub-pixel, the main body has a second symmetry axis in the second direction; and the at least two sub-power lines with the orthographic projections overlapping the orthographic projection of the main body on the substrate are disposed at two sides of the center of the main body substantially axisymmetrically about the second symmetry axis.

9. The electroluminescent display panel according to claim 6, wherein: the conduction lines comprise third conduction lines; one third conduction line is located between a first-color sub-pixel in a repeating unit group, and a third-color sub-pixel that is in an adjacent repeating unit group and nearest to the first-color sub-pixel; and the third conduction line is disposed on a side of the main body of the corresponding third-color sub-pixel facing away from the auxiliary portion.

10. The electroluminescent display panel according to claim 9, wherein the third conduction line is in at least one of a polyline shape and a curved shape.

11. The electroluminescent display panel according to claim 5, wherein in the first-color sub-pixel, a size of an overlapping area between the orthographic projection of the main body on the substrate and the nearest sub-power line is smaller than 80% of a width of the sub-power line in the first direction.

12. The electroluminescent display panel according to claim 5, wherein in a same sub-pixel, an orthographic projection of the main body on the substrate does not overlap an orthographic projection of the first via hole on the substrate.

13. The electroluminescent display panel according to claim 12, wherein in a same sub-pixel, an orthographic projection of the second via hole on the substrate does not overlap the orthographic projection of the first via hole on the substrate.

14. The electroluminescent display panel according to claim 5, wherein: the third direction is same as the first direction, and the fourth direction is same as the second direction; the second-color sub-pixel pair comprises a first second-color sub-pixel and a second second-color sub-pixel; and
  in a same repeating unit group, a first via hole of the first-color sub-pixel, a first via hole of the second second-color sub-pixel in the second-color sub-pixel pair, and a second via hole of the third-color sub-pixel are arranged on a same straight line along the first direction.

15. The electroluminescent display panel according to claim 1, wherein in at least one sub-pixel, a ratio of a size of the main body in the fourth direction to a size of the main body in the third direction is γ1, and a value range of γ1 is 1.2-3.

16. The electroluminescent display panel according to claim 1, wherein: the third direction is same as the first direction, and the fourth direction is same as the second direction; a size of the main body of the third-color sub-pixel in the second direction is larger than a size of the main body of the third-color sub-pixel in the first direction; and a size the main body of the first-color sub-pixel in the second direction is larger than a size of the main body of the first-color sub-pixel in the first direction.

17. The electroluminescent display panel according to claim 1, wherein:
  the first conductive layer comprises a first bridging line, a first connection line, and a plurality of signal line groups arranged at intervals in the first direction, wherein in each of the plurality of sub-pixels, the auxiliary portion is electrically connected to the first connection line through the first via hole;
  each of the signal line groups comprises at least two different signal lines, and the signal lines extend along the second direction; and
  in at least one sub-pixel, the orthographic projection of the main body on the substrate overlaps an orthographic projection of at least one of the signal line groups on the substrates and center lines in the second direction of the signal lines in the signal line group with orthographic projection overlapping the orthographic projection of the main body on the substrate are substantially axisymmetric about a symmetry axis of the main body along the second direction.

18. The electroluminescent display panel according to claim 17, wherein: the third direction is same as the first direction, and the fourth direction is same as the second direction; a size of the main body of the third-color sub-pixel in the second direction is larger than a size of the main body of the third-color sub-pixel in the first direction; and a size of the main body of the first-color sub-pixel in the second direction is larger than a size of the main body of the first-color sub-pixel in the first direction.

19. The electroluminescent display panel according to claim 17, wherein for one of the repeating unit groups, the first via holes of the third-color sub-pixels and the first via holes of the second second-color sub-pixels in the second-color sub-pixel pairs, in the repeating unit group, and the first via holes of the first second-color sub-pixels in the second-color sub-pixel pairs adjacent to the repeating unit group are arranged on a same straight line along the first direction.

20. The electroluminescent display panel according to claim 17, wherein each of the signal line groups comprises a data line configured to transmit a data signal and a power line configured to transmit a driving voltage.

21. A display device, comprising the electroluminescent display panel according to claim 1.

* * * * *